United States Patent
Yoshikawa et al.

(10) Patent No.: US 7,535,059 B2
(45) Date of Patent: May 19, 2009

(54) SEMICONDUCTOR DEVICE AND MANUFACTURING METHOD OF THE SEMICONDUCTOR DEVICE

(75) Inventors: Koh Yoshikawa, Matsumoto (JP); Akio Sugi, Matsumoto (JP); Kouta Takahashi, Matsumoto (JP); Manabu Takei, Shiojiri (JP); Haruo Nakazawa, Matsumoto (JP); Noriyuki Iwamuro, Matsumoto (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 11/564,053

(22) Filed: Nov. 28, 2006

(65) Prior Publication Data

US 2007/0158740 A1 Jul. 12, 2007

(30) Foreign Application Priority Data

Nov. 28, 2005 (JP) ............................. 2005-342587

(51) Int. Cl.
*H01L 29/76* (2006.01)
(52) U.S. Cl. ..................... 257/341; 257/342; 257/330; 257/E29.201
(58) Field of Classification Search ............... 257/327, 257/328, 329, 330, 492, 493, E29.198, E29.2, 257/E29.201, 341
See application file for complete search history.

(56) References Cited

U.S. PATENT DOCUMENTS

| 6,673,679 B1 * | 1/2004 | Miyasaka et al. ........... 438/268 |
| 2003/0132450 A1 * | 7/2003 | Minato et al. ............... 257/110 |

2005/0184336 A1 * 8/2005 Takahashi et al. ........... 257/328

FOREIGN PATENT DOCUMENTS

| JP | 04-146674 A | 5/1992 |
| JP | 04-233765 A | 8/1992 |
| JP | 05-335582 A | 12/1993 |
| JP | 09-266311 A | 10/1997 |

(Continued)

OTHER PUBLICATIONS

Hidefumi Takaya et al., "Floating Island and Thick Bottom Oxide Trench Gate MOSFET (FITMOS): A 60V Ultra Low On-Resistance Novel MOSFET with Superior Internal Body Diode", Proceedings of the 17th International Symposium on Power Semiconductor Devices & IC's, May 23-26, 2005, pp. 43-46, Santa Barbara, CA.

(Continued)

*Primary Examiner*—Evan Pert
*Assistant Examiner*—Selim Ahmed
(74) *Attorney, Agent, or Firm*—Rossi, Kimms & McDowell LLP

(57) ABSTRACT

A semiconductor device including an n-type semiconductor substrate, a p-type channel region and a junction layer provided between the n-type semiconductor substrate and the p-type channel region is disclosed. The junction layer has n-type drift regions and p-type partition regions alternately arranged in the direction in parallel with the principal surface of the n-type semiconductor substrate. The p-type partition region forming the junction layer is made to have a higher impurity concentration than the n-type drift region. This enables the semiconductor device to have an enhanced breakdown voltage and, at the same time, have a reduced on-resistance.

14 Claims, 20 Drawing Sheets

FOREIGN PATENT DOCUMENTS

| | | |
|---|---|---|
| JP | 2000-208527 A | 7/2000 |
| JP | 2001-111041 A | 4/2001 |
| JP | 2002-289869 A | 10/2002 |
| JP | 2004-72068 A | 3/2004 |
| JP | 2004-119611 A | 4/2004 |

OTHER PUBLICATIONS

T. Dyer et al., "Monolithic Integration of Trench Vertical DMOS (VDMOS) Power Transistors into a BCD Process", Proceedings of the 17th International Symposium on Power Semiconductor Devices & IC's, May 23-26, 2005, pp. 47-50, Santa Barbara, CA.

* cited by examiner

SEMICONDUCTOR DEVICE AND MANUFACTURING METHOD OF THE SEMICONDUCTOR DEVICE

CROSS REFERENCE TO RELATED APPLICATIONS

This application claims priority from Japanese application serial no. 2005-342587, filed on Nov. 28, 2005, the contents of which are incorporated herein in their entirety.

BACKGROUND OF THE INVENTION

A. Field of the Invention

The present invention relates to a high-power vertical insulated gate semiconductor device, and in more detail, to a trench gate superjunction semiconductor device having a trench gate, which has a trench, an insulator film formed therein and a control electrode filling the trench with the insulator film held between, and having a superjunction layer in a semiconductor substrate.

B. Description of the Related Art

In recent years, in compliance with requirements for downsizing and performance enhancement in power source equipment in the field of power electronics, efforts have been concentrated on a power semiconductor device to improve the performance in obtaining a high breakdown voltage, a high current capacity and along with this, a low power loss, a high breakdown capability and a high operation speed. A superjunction substrate is known as a substrate structure of a power semiconductor device for enabling a device to obtain such a high breakdown voltage, a high current capacity and a low power loss. Moreover, for a surface structure of a power semiconductor device, a vertical or trench MOS power device has been proposed.

For a substrate structure of a power semiconductor device, two kinds of substrates, a semiconductor substrate having a single conductivity type and a superjunction substrate, are widely known. Here, a superjunction substrate is a substrate including a superjunction layer, a layer in which a plurality of first conductivity type semiconductor regions (for example, n-type drift regions) and a plurality of second conductivity type semiconductor regions (for example, p-type partition regions) are alternately joined.

The superjunction substrate, by forming the superjunction layer, can expand the space charge region of the whole superjunction layer at turning-off even when an impurity concentration in each layer of the superjunction layer is high. Therefore, the superjunction substrate is considered to be more advantageous than a semiconductor substrate having a single conductivity type in that the superjunction substrate can reduce on-resistance particularly in a high breakdown voltage semiconductor device.

As a technology for a power device using a superjunction semiconductor substrate, the following technology is known (see JP-A-2004-119611, for example). In the technology, in a power MOSFET having a superjunction structure, an impurity concentration in a p RESURF layer is made to have a distribution of being reduced in the direction of the depth (an inclined profile). This causes a reduction in a breakdown voltage, which is due to an unbalanced amount between the amount of impurity in the p RESURF layer and the amount of impurity in an n drift layer, smaller than that in a previous device.

Furthermore, a semiconductor device is known which has a high breakdown voltage together with reduced on-resistance by improving a structure of a drift region in which a depletion layer is produced in a turned-off state (see JP-A-09-266311, for example).

Next, explanations will be made about the surface structures of power semiconductor devices. As surface structures of power semiconductor devices, two kinds of structures are known. One is a planar structure in which a MOS gate is provided on a flat plate. The other is a trench structure in which a MOS gate is formed by filling a trench. A trench MOS power device has a trench gate structure in which a number of trench MOS cells, each having a trench side wall provided as a channel region, are arranged in a line on a semiconductor substrate. In general, a trench MOS device is considered to be more advantageous than a planar MOS device in that its performance is easily improved by reducing resistance of the channel.

In a recent vertical device, a trench type device having a structure with gate electrodes filling trenches has become a focus of attention since the structure allows low on-resistance characteristics to be easily obtained. For such a vertical trench type MOS power device, a vertical MOSFET device is known together with its manufacturing method. In the device, the input capacitance is reduced without increasing a threshold voltage of a switching operation, by which the driving loss and switching loss are significantly improved (see JP-A-05-335582, for example).

Moreover, a technology is known by which a MOSFET having the gates formed inside the trenches are miniaturized to simplify the manufacturing process (see JP-A-04-233765, for example).

Furthermore, an insulated gate bipolar semiconductor device is known together with a method for its manufacture. The device has a low on-voltage though the device has a high operation speed and a high breakdown voltage (see JP-A-04-146674, for example).

An example of structures of vertical MOSFETs, disclosed in the patent documents JP-A-2004-119611, JP-A-09-266311, JP-A-05-335582, JP-A-04-233765 and JP-A-04-146674, is shown in FIG. 23. Moreover, an example of structures of vertical IGBTs, disclosed in the above patent documents, is shown in FIG. 24. Here, related art will be shown with reference to FIG. 23. Furthermore, in FIG. 24, similar components to those in FIG. 23 are denoted by the same reference numerals. In FIG. 23, a semiconductor substrate is formed of $n^+$-type drain layer 101 and $n^-$-type drain layer 102. On the surface of $n^-$-type drain layer 102, $p^-$-type channel region 103 is provided.

A plurality of trenches 104 are formed from the surface of $p^-$-type channel region 103 to a depth reaching $n^-$-type drain layer 102. On the surface of each trench 104, gate oxide film 105 is formed. Further, the inside of each trench 104 is filled with gate electrode 106 of, for example, polycrystalline silicon. On the surface of $p^-$-type channel region 103, $p^+$-type body region 107 is formed approximately at the midpoint between trenches 104 that are adjacent to each other. Between $p^+$-type body region 107 and trench 104, $n^{++}$-type source region 108 is formed.

Moreover, on gate electrode 106, insulator film 109 is formed, on which metal electrode 110 of metal such as aluminum, for example, is further formed over the whole surface of a cell region. Insulator film 109 isolates gate electrode 106 from metal electrode 110. Metal electrode 110 is formed so as to be in ohmic contact with $n^{++}$-type source region 108 and $p^+$-type body region 107. Also on the surface of the semiconductor substrate opposite to the surface on which metal electrode 110 is formed, metal electrode 111 is formed.

In the vertical MOSFET or the vertical IGBT, by applying a voltage equal to the specified threshold value or more to gate electrode 106, an n-type inversion layer is formed along each trench 104 in p⁻-type channel region 103 to provide a current path between each n⁺⁺-type source region 108 and each of drain layers 101 and 102 in the n-type semiconductor substrate. With the current path thus provided, the region between the source and the drain of the vertical MOSFET is brought into a turned-on state. By reducing the voltage applied to gate electrode 106 to the threshold value or less, the n-type inversion layer in p⁻-type channel region 103 disappears. Thus, the region between the source and the drain of the vertical MOSFET is brought into a turned-off state.

In the vertical MOSFET with the above arrangement, a vertical current path is formed along each trench 104. Therefore, the area of a current path is significantly enlarged compared with that in a planar vertical MOSFET. This provides the advantage of allowing on-resistance to be reduced, whereas in the trench vertical MOSFET, the electric field strength at the bottom of trench 104 is increased to reduce the breakdown voltage of the semiconductor device. Furthermore, in the state in which the electric field strength at the bottom of trench 104 is high (when the semiconductor substrate is turned-off), carriers are injected into gate oxide film 105 to degrade the long term reliability of the MOS gate section.

Next to this, electric field strength distributions will be shown about the trench gate MOSFET with the structure shown in FIG. 23 and a diode structure without trench being formed, both at avalanche breakdown. FIG. 25 is a graph showing the respective electric field strength distributions of the trench gate MOSFET and the diode structure without trench being formed, both at avalanche breakdown. In FIG. 25, the vertical axis represents an electric field strength (V/cm) and the horizontal axis represents a distance (μm) in the direction of the depth of the trench from the surface of p⁻-type channel region 103. Distribution 121 represents the electric field strength distribution in the case without trench and distribution 122 represents the electric field strength distribution in the case with trench (trench gate MOSFET).

In FIG. 23, trench 104 is shown to have a rectangular cross sectional shape. Actually, however, the bottom of trench 104 is formed into a half-cylinder-like shape having a radius of curvature of 0.6 μm and extending in a direction approximately perpendicular to the direction in which rows of trenches 104 are formed to be aligned side by side. Gate oxide film 105 is formed along the inner surface of trench 104 with a thickness of 0.1 μm. The inside of gate oxide film 105 is filled with gate electrode 106 with a radius of curvature at the bottom being 0.5 μm. Further, the spacing between trenches 104 is 5 μm. The impurity concentration in the n-layer is determined to be $2.5 \times 10^{14}$ cm⁻³.

In FIG. 25, it is shown that the electric field strength of the trench gate MOSFET indicated with distribution 122 increases abruptly at the bottom of trench 104 compared with the case of forming no trench 104 indicated with distribution 121. The trench gate MOSFET causes avalanche breakdown at this section only to provide a lower breakdown voltage than that in the case without trench 104.

As a measure for reducing the increase in the electric field strength at the bottom of the trench of the vertical MOSFET disclosed in each of the patent documents JP-A-2004-119611, JP-A-09-266311, JP-A-05-335582, JP-A-04-233765 and JP-A-04-146674, and for enhancing the breakdown voltage, a structure of a semiconductor device and a method for its manufacture is known. In the structure and the method, a p-type layer is formed at the bottom of a trench or a p-type channel layer is deeply formed (see, Hidefumi Takaya et al., "Floating Island and Thick Bottom Oxide Trench Gate MOSFET (FITMOS)—A 60 V Ultra Low On-Resistance Novel MOSFET with Superior Internal Body Diode—", Proceedings of ISPSD 2005, pp. 43-46 (2005), and T. Dyer et al., "Monolithic Integration of Trench Vertical DMOS (VDMOS) Power Transistors into BCD Process", Proceedings of ISPSD 2005, pp. 47-50 (2005), for example).

By the related art described in Takaya's or Dyer's document, the breakdown voltage of a semiconductor device can be enhanced by reducing the electric field strength at the bottom of the trench. The enhanced breakdown voltage, however, caused an accompanying problem of abruptly raising the on-voltage of the semiconductor device, and the measure for lowering the on-voltage caused a problem of abruptly reducing the breakdown voltage of the semiconductor device.

In order to solve the problems with the foregoing related art, an object of the invention is to provide a semiconductor device that can enhance a breakdown voltage as a characteristic at turning-off by weakening the electric field strength at the bottom of a trench, and at the same time, can lower the on-voltage as a characteristic in a turned-on state and a method of manufacturing the semiconductor device.

The present invention is directed to overcoming or at least reducing the effects of one or more of the problems set forth above.

SUMMARY OF THE INVENTION

A superjunction substrate has both n-type regions and p-type regions in a drift layer that is held between a semiconductor substrate, having a high impurity concentration, and a channel region. Thus, the superjunction substrate has a characteristic that makes a MOSFET turned-on even with an electric field strength distribution that was impossible in a related substrate structure (an electric field strength distribution such that the electric field strength on the substrate surface on the side opposite to the channel region is higher than the electric field strength on the side of the channel region). This characteristic is applied to the invention.

For solving the foregoing problems and achieving various objectives, a semiconductor device according to a first aspect of the invention is characterized in that the semiconductor device includes a first conductivity type semiconductor substrate, a second conductivity type channel region, and a junction layer provided between the first conductivity type semiconductor substrate and the second conductivity type channel region, the junction layer having a plurality of first conductivity type semiconductor regions and a plurality of second conductivity type semiconductor regions alternately arranged in the direction in parallel with the principal surface of the first conductivity type semiconductor substrate, and that the second conductivity type semiconductor region is made to have a higher average impurity concentration than the first conductivity type semiconductor region.

A semiconductor device according to a second aspect of the invention is characterized in that, in the semiconductor device according to the first aspect of the invention, the second conductivity type channel region has a plurality of trenches formed from the surface so as to reach the junction layer, each of the trenches having an insulator film formed on the inside face and being filled with an electrode with the insulator film put between the trench and the electrode.

A semiconductor device according to a third aspect of the invention is characterized in that, in the semiconductor device according to the first or the second aspect of the invention, the first conductivity type semiconductor region has an impurity concentration whose average value ($N_{1\text{-}semiconductor}$) satisfies the following expression (1):

$$N_{1\text{-}semiconductor} \geq \frac{\varepsilon_{semiconductor} \times E_{critical}^2}{4 \times q \times V_{BD}} \quad (1)$$

where VBD is the maximum preventable voltage of the semiconductor device, $\varepsilon_{semiconductor}$ is the permittivity of the semiconductor device, $E_{critical}$ is a critical electric field strength and q is the elementary charge.

A semiconductor device according to a fourth aspect of the invention is characterized in that, in the semiconductor device according to the first or the second aspect of the invention, the first conductivity type semiconductor region is formed of a plurality of layers of the first conductivity type having impurity concentrations different from one another, of which the layer with the lowest impurity concentration has an impurity concentration whose average value ($N_{1min\text{-}semiconductor}$) satisfies the following expression (2):

$$N_{1min\text{-}semiconductor} \geq \frac{\varepsilon_{semiconductor} \times E_{critical}^2}{4 \times q \times V_{BD}} \quad (2)$$

where $V_{BD}$ is the maximum preventable voltage of the semiconductor device, $\varepsilon_{semiconductor}$ is the permittivity of the semiconductor device, $E_{critical}$ is a critical electric field strength and q is the elementary charge.

A semiconductor device according to a fifth aspect of the invention is characterized in that, in the semiconductor device according to any one of the first to fourth aspects of the invention, the correlation of the average value ($N_{2\text{-}superjunction}$) of the impurity concentration of the second conductivity type semiconductor region and the average value ($N_{1\text{-}superjunction}$) of the impurity concentration of the first conductivity type semiconductor region is expressed by the following expression (3):

$$N_{2\text{-}superjunction} \geq 1.02 \times N_{1\text{-}superjunction} \quad (3)$$

A semiconductor device according to a sixth aspect of the invention is characterized in that, in the semiconductor device according to the first aspect of the invention, a width of the second conductivity type semiconductor region spreads in a thickness direction of the semiconductor substrate, and the average impurity concentration of the junction layer is $2.4 \times 10^{14}$ cm$^{-3}$ or more.

A semiconductor device according to a seventh aspect of the invention is characterized in that, in the semiconductor device according to the fourth aspect of the invention, the average impurity concentration of the junction layer is $8.4 \times 10^{13}$ cm$^{-3}$ or more.

A semiconductor device according to an eighth aspect of the invention is characterized in that, in the semiconductor device according to any one of the first to seventh aspects of the invention, the junction layer is formed in a stripe-like shape.

A semiconductor device according to a ninth aspect of the invention is characterized in that, in the semiconductor device according to the second aspect of the invention, the insulator film is formed of a silicon oxide film.

A semiconductor device according to a tenth aspect of the invention is characterized in that, in the semiconductor device according to the first aspect of the invention, the first conductivity type semiconductor region is formed of silicon.

A semiconductor device according to an eleventh aspect of the invention is characterized in that, in the semiconductor device according to the second aspect of the invention, the semiconductor device is a MOSFET.

A semiconductor device according to a twelfth aspect of the invention is characterized in that, in the semiconductor device according to the second aspect of the invention, the semiconductor device is an insulated gate bipolar transistor.

A semiconductor device according to a thirteenth aspect of the invention is characterized in that the semiconductor device includes a first conductivity type semiconductor substrate, a second conductivity type channel region, and a junction layer provided between the first conductivity type semiconductor substrate and the second conductivity type channel region, the junction layer having a plurality of first conductivity type semiconductor regions and a plurality of second conductivity type semiconductor regions alternately arranged in the direction in parallel with the principal surface of the first conductivity type semiconductor substrate, and that the second conductivity type channel region has a plurality of trenches formed from the surface so as to reach the junction layer, each of the trenches having an insulator film formed on the inside face and being filled with an electrode with the insulator film put between the trench and the electrode, and an electric field strength in the vicinity of the trench is lower than an electric field strength in the junction layer other than the region in the vicinity of the trench.

A semiconductor device according to a fourteenth aspect of the invention is characterized in that, in the semiconductor device according to the thirteenth aspect of the invention, the electric field strength in the junction layer increases with an increase in the distance from the bottom of the trench toward the first conductivity type semiconductor substrate.

A method of manufacturing a semiconductor device according to a fifteenth aspect of the invention is characterized by including the steps of forming a first conductivity type semiconductor layer by epitaxial growth on a first conductivity type semiconductor substrate with a specified impurity concentration, the first conductivity type semiconductor layer having an impurity concentration lower than the specified impurity concentration, forming a plurality of trenches in the first conductivity type semiconductor layer, and forming a second conductivity type semiconductor layer by epitaxial growth in each of the trenches, the second conductivity type semiconductor layer being made to have a higher impurity concentration than the first conductivity type semiconductor layer.

A method of manufacturing a semiconductor device according to a sixteenth aspect of the invention is characterized in that, in the method of manufacturing a semiconductor device according to the fifteenth aspect of the invention, the step of forming the first conductivity type semiconductor layer includes the steps of growing a plurality of first conductivity type layers whose respective impurity concentrations are different from one another.

According to the first aspect of the invention, the electric field strength in the junction layer in the vicinity of the second conductivity type channel region can be reduced. This can enhance the breakdown voltage of the semiconductor device and, at the same time, can reduce the on-voltage of the semiconductor device.

According to the second aspect of the invention, the electric field strength at the bottom of the trench in the junction layer can be reduced. This can enhance the breakdown voltage of the semiconductor device and, at the same time, can reduce the on-voltage of the semiconductor device.

According to the third to the eleventh aspects of the invention, the electric field strength in the junction layer in the vicinity of the second conductivity type channel region can be reduced.

According to the twelfth aspect of the invention, the invention according to any one of the first to the eleventh aspects of the invention can be realized by a MOSFET.

According to the thirteenth aspect of the invention, the invention according to any one of the first to the eleventh aspects can be realized by an insulated gate bipolar transistor.

According to the fourteenth aspect or the fifteenth aspect of the invention, the breakdown voltage of the semiconductor device can be enhanced and, at the same time, the on-voltage of the semiconductor device can be reduced.

According to the sixteenth aspect of the invention, the electric field strength in the junction layer in the vicinity of the second conductivity type channel region can be reduced. Thus, the breakdown voltage of the semiconductor device can be enhanced and, at the same time, the on-voltage of the semiconductor device can be reduced.

By the semiconductor device and the method of manufacturing the semiconductor device according to the invention, an effect is achieved that can raise a breakdown voltage as a characteristic at turning-off by weakening the electric field strength at the bottom of a trench, and at the same time, can lower the on-voltage as a characteristic in a turned-on state.

BRIEF DESCRIPTION OF THE DRAWINGS

The foregoing advantages and features of the invention will become apparent upon reference to the following detailed description and the accompanying drawings, of which.

DETAILED DESCRIPTION OF PREFERRED EMBODIMENTS

In the following, preferred embodiments of the semiconductor device and the method of manufacturing the semiconductor device according to the invention will be explained in detail with reference to the attached drawings.

Embodiment 1

Arrangement of the Semiconductor Device

Figure 1:
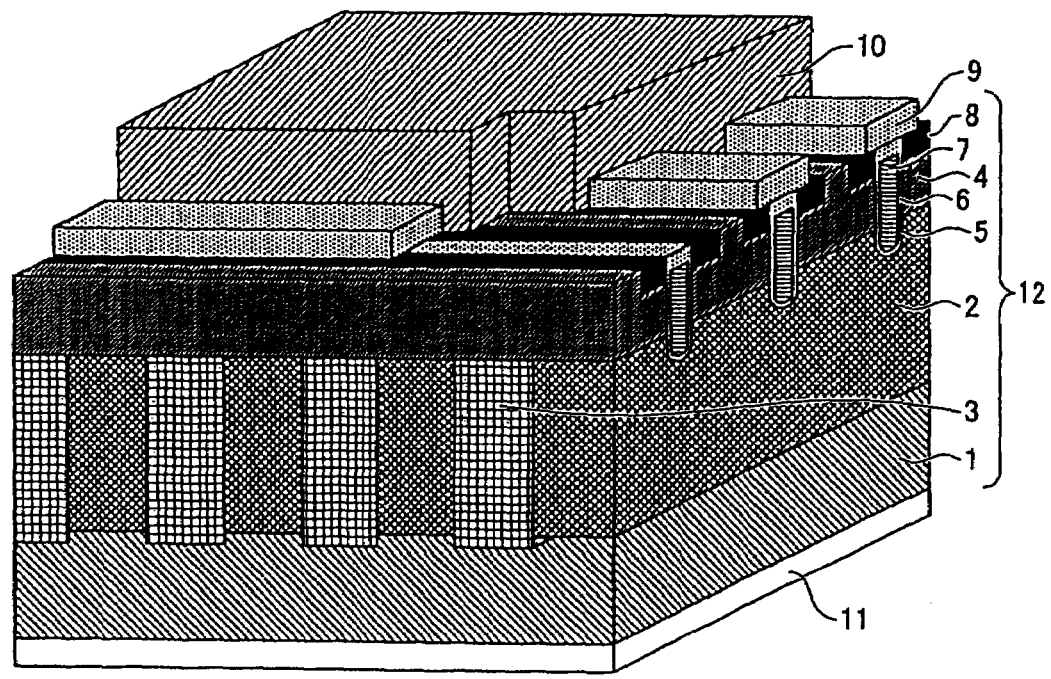
FIG. 1 is a perspective view showing an example of an arrangement of a semiconductor device according to Embodiment 1 of the invention.

FIG. 1 is a perspective view showing an example of an arrangement of a semiconductor device according to Embodiment 1 of the invention. In Embodiment 1 a superjunction MOSFET with a breakdown voltage of 600 V is shown as an example of a vertical trench gate MOS power device. In the following description, the first conductivity type is n-type and the second conductivity type is p-type.

In FIG. 1, n-type drift regions 2 (first conductivity type semiconductor regions) and p-type partition regions 3 (second conductivity type semiconductor regions) are alternately provided to be aligned side by side on one of principal surfaces of n-type semiconductor substrate 1. N-type drift regions 2 and p-type partition regions 3 form a superjunction layer. On the superjunction layer, a p-type channel region 4 is formed. P-type channel region 4 has trenches 5 formed from the surface, each of which reaches the superjunction layer.

The bottom of each of the trenches 5 has a radius of curvature of 0.6 μm. Trenches 5 are formed to extend in the direction approximately perpendicular to the direction in which n-type drift regions 2 and partition regions 3 of the superjunction layer are formed. Each of the trenches 5 is formed with an opening width of approximately 1.2 μm and a depth of approximately 3.5 μm. The pitch of the aligned trenches 5 is 5 μm. Inside each of the trenches 5, gate oxide film 6 is formed. Gate oxide film 6 has a thickness of 100 nm, for example. Here, gate oxide film 6 can be made of a silicon oxide film, for example.

The inside of trench 5 is filled with gate electrode 7 of a material such as polysilicon, for example, with gate oxide film 6 in between. The bottom of gate electrode 7 has a radius of curvature of, for example, 0.4 μm. On the surface of p-type channel region 4, n-type source region 8 is formed so as to be in contact with a part of the outside of gate oxide film 6 on the side wall of trench 5. A region from n-type semiconductor substrate 1 to n-type source region 8 is superjunction semiconductor substrate 12.

Furthermore, insulator film 9 is formed so as to cover trench 5 and a part of n-type source region 8. Moreover, source electrode 10 is formed so as to cover insulator film 9 and further a part of the surface of p-type channel region 4 including the remaining part of n-type source region 8. On the surface of n-type semiconductor substrate 1 opposite to the surface on which the superjunction layer is formed, drain electrode 11 is formed.

The Method of Manufacturing the Semiconductor Device

Figure 2:
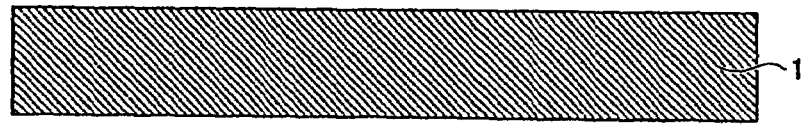
FIG. 2 is a cross sectional view showing an arrangement in the course of manufacturing the semiconductor device shown in FIG. 1 in the step of preparing an n-type semiconductor substrate.

Next, a method of manufacturing the semiconductor device will be explained. FIGS. 2 to 6 are cross sectional views showing arrangements in the steps of manufacturing the semiconductor device shown in FIG. 1. First, as shown in FIG. 2, n-type semiconductor substrate 1 (first conductivity type semiconductor substrate) is prepared with the direction of crystal plane taken as (100) and an impurity concentration which is sufficiently high. Here, for n-type semiconductor substrate 1, an n-type low-resistance silicon substrate was used with a concentration of impurities such as antimony atoms, for example, being on the order of $2 \times 10^{18}$ cm$^{-3}$.

Figure 3:
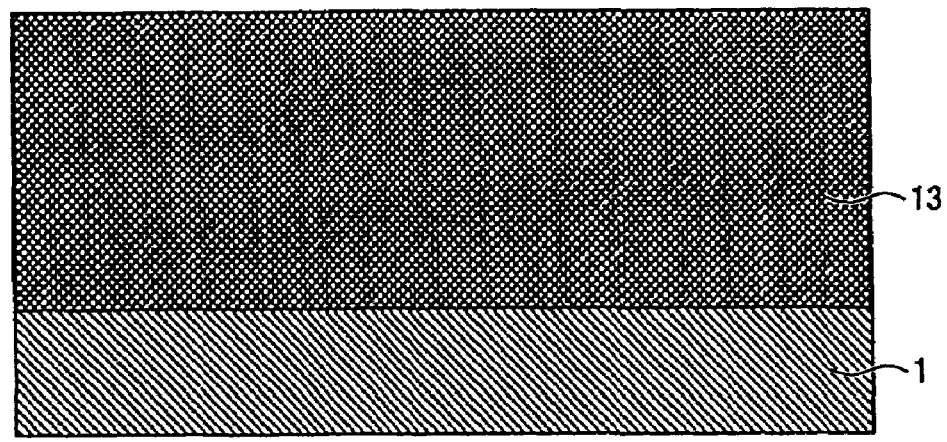
FIG. 3 is a cross sectional view showing an arrangement in the course of manufacturing the semiconductor device shown in FIG. 1 in the step next to that shown in FIG. 2 in which an n-type semiconductor is formed on the n-type semiconductor substrate.

Then, as shown in FIG. 3, on n-type semiconductor substrate 1, n-type semiconductor 13 with a concentration of impurities such as phosphorus atoms, for example, being on the order of $1.3 \times 10^{16}$ cm$^{-3}$ is epitaxially grown to a thickness of approximately 50 μm, for example. N-type semiconductor 13 is formed into n-type drift regions 2 shown in FIG. 1. Therefore, in FIGS. 4 to 6 in the following, the regions equivalent to the n-type drift regions are designated by the same reference numeral 13.

Figure 4:
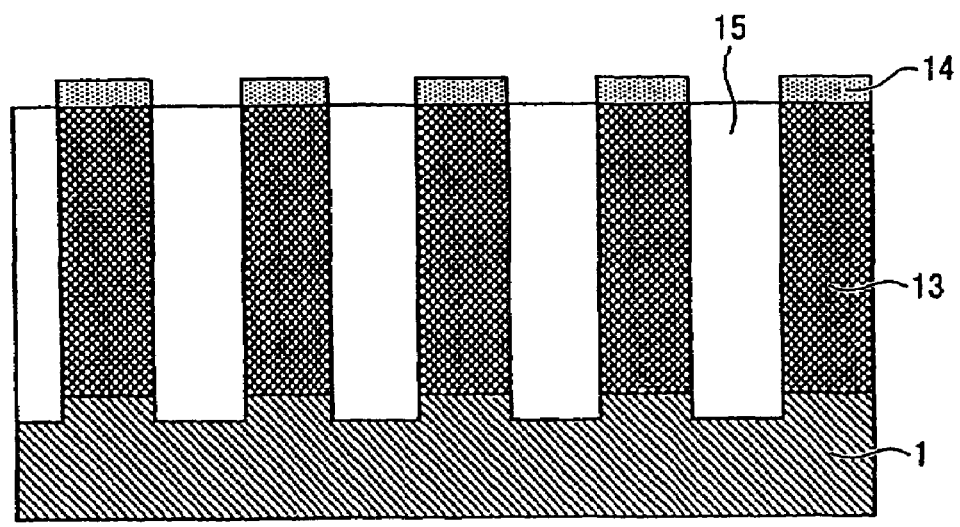
FIG. 4 is a cross sectional view showing an arrangement in the course of manufacturing the semiconductor device shown in FIG. 1 in the step next to that shown in FIG. 3 in which trenches are formed in the n-type semiconductor with a patterned oxide film (or an nitride film) that is formed on the n-type semiconductor substrate used as a mask.

Following this, as shown in FIG. 4, an oxide film (or a nitride film etc.), for example, is grown on the surface of n-type semiconductor 13 as an insulator film with a thickness of, for example, 1.6 μm. The thickness of the oxide film (or the nitride film etc.) is determined on the basis of the selectivity of the oxide film (or the nitride film, etc.) to silicon so that the oxide film (or the nitride film etc.) remains even after the trench with a depth of 50 μm, for example, is formed. Subsequent to this, patterning of the oxide film (or the nitride film etc.) is carried out by photolithography or etching to form mask 14.

The width of the section of the oxide film (or the nitride film, etc.) and the width of the section of an opening of mask 14 are, for example, 2 μm and 2 μm, respectively. In short, masks each having a width of 2 μm are arranged at 2 μm intervals, for example. Following this, by carrying out dry etching, for example, trenches 15 each having a depth of approximately 50 μm, for example, are formed in n-type semiconductor 13.

Figure 5:
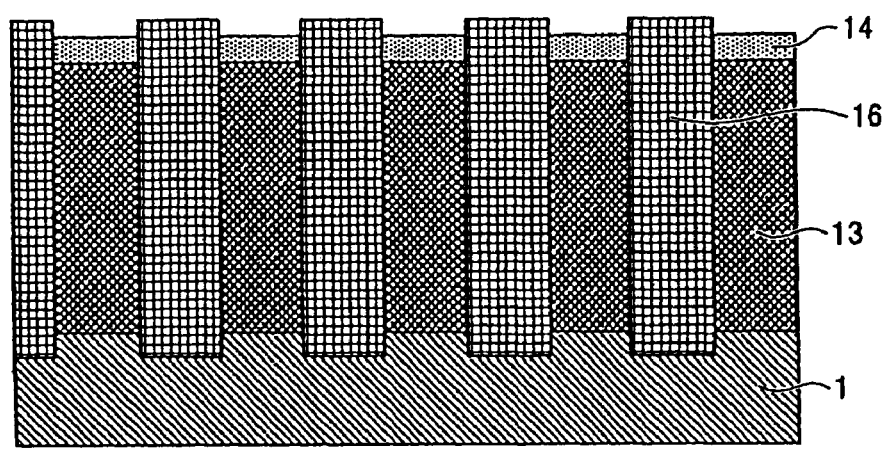
FIG. 5 is a cross sectional view showing an arrangement in the course of manufacturing the semiconductor device shown in FIG. 1 in the step next to that shown in FIG. 4 in which a p-type semiconductor is made grown in each of the trenches to fill the trench.

Then, as shown in FIG. 5, boron-doped p-type semiconductor 16 is epitaxially grown in each of trenches 15 to fill trench 15 with p-type semiconductor 16. At this time, the epitaxially grown layer of p-type semiconductor 16 is grown until the grown layer is higher than the upper surface of mask 14. P-type semiconductor 16 filling trench 15 becomes p-type partition region 3 of the superjunction layer.

Figure 6:
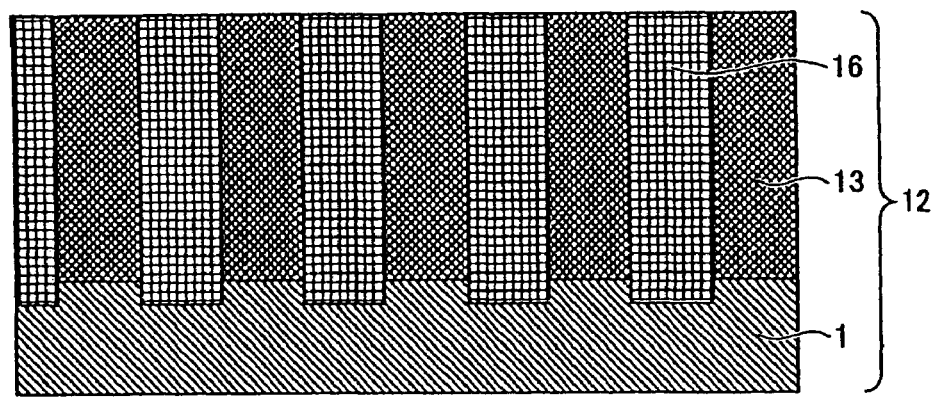
FIG. 6 is a cross sectional view showing an arrangement in the course of manufacturing the semiconductor device shown in FIG. 1 in the step next to that shown in FIG. 5 in which planarization of the surface of parallel p-n junctions is carried out to form the superjunction semiconductor substrate.

Moreover, as shown in FIG. 6, planarization of the surface of parallel p-n junctions is carried out by CMP (Chemical Mechanical Polishing) and oxide film etching to form superjunction semiconductor substrate 12. At this time, the thickness of the superjunction layer in superjunction semiconductor substrate 12 is taken as, for example, 47 μm. Thereafter, trenches 5, each having a depth of 3.5 μm and an opening width of 1.2 μm, are formed at equal intervals with a pitch of 5 μm by a related technology.

By carefully forming each of trenches 5, the bottom of trench 5 can be formed to have a radius of curvature of 0.6 μm. Thereafter, gate oxide film 6 with a thickness of 100 nm is grown along the sidewall of trench 5 before filling trench 5 with gate electrode 7. Subsequent to this, p-type channel region 4 and n-type source region 8 are formed. In succession to this, insulator film 9, source electrode 10, drain electrode 11 and a passivation layer are formed, by which the superjunction MOSFET shown in FIG. 1 is completed.

Figure 7:
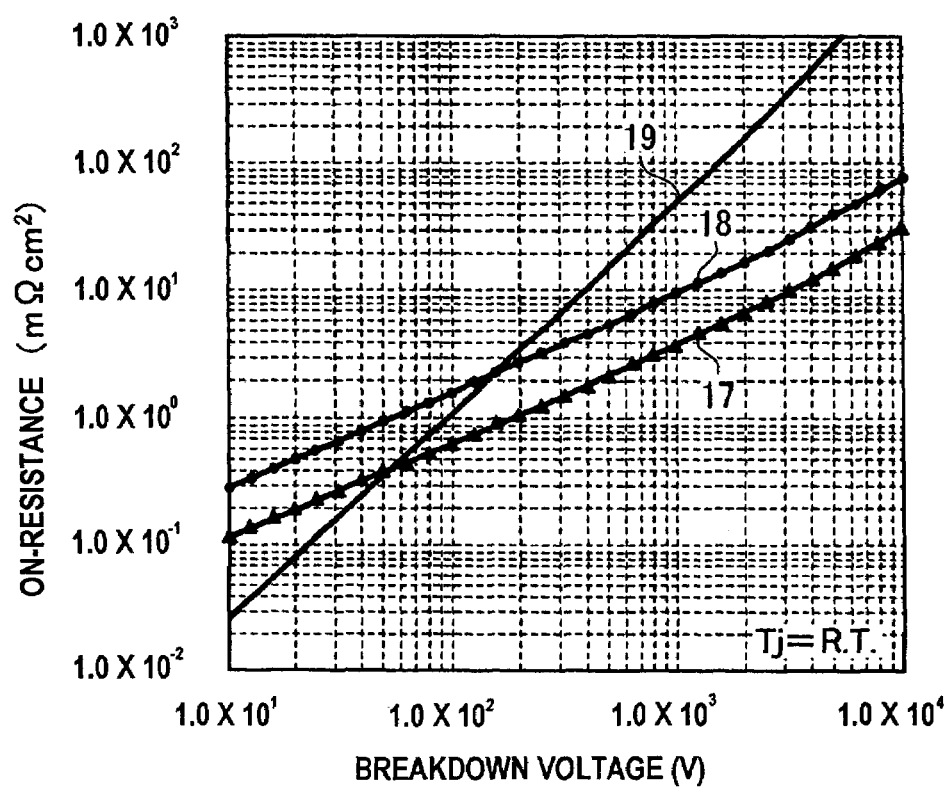
FIG. 7 is a graph showing a relationship between the on-resistance and the breakdown voltage about each of the semiconductor device according to Embodiment 1 and the semiconductor device of related art.

The on-resistance of superjunction semiconductor substrate 12 is approximately 5 mΩcm$^2$. Next, a relationship between the on-resistance and the breakdown voltage is shown about each of the semiconductor device according to Embodiment 1 and the semiconductor device of related art. FIG. 7 is a graph showing the relationship between the on-resistance and the breakdown voltage. In FIG. 7, the vertical axis represents an on-resistance (mΩcm$^2$) and the horizontal axis represents a breakdown voltage (V). Reference numerals 17 and 18 denote on-resistance characteristics in the cases in which trenches 5 are formed at 2 μm intervals and 5 μm intervals, respectively. Reference numeral 19 denotes the on-resistance characteristic of a MOSFET of related art.

In the graph shown in FIG. 7, the value of on-resistance in any of the characteristics denoted by reference numerals 17, 18 and 19 increases with an increase in the breakdown voltage. The inclinations of the characteristics denoted by reference numerals 17 and 18 are approximately equal to each other and are smaller compared with the inclination of the characteristic denoted by reference numeral 19. In other words, compared with the related art characteristic denoted by reference numeral 19, the rate of increase in the value of on-resistance against an increase in a breakdown voltage is smaller in the semiconductor device according to Embodiment 1. Thus, the semiconductor device according to Embodiment 1 exhibits an excellent trade-off characteristic between breakdown voltage and on-resistance. This is because the superjunction layer is formed with a phosphorus concentration within the range of the values expressed by the following expression (4):

$$N_{1-semiconductor} \geq \frac{\varepsilon_{semiconductor} \times E_{critical}^2}{4 \times q \times V_{BD}} \quad (4)$$

where $N_{1-semiconductor}$ is the average value of an impurity concentration in the n-type drift region 2, $V_{BD}$ is the maximum preventable voltage of the semiconductor device, $\varepsilon_{semiconductor}$ is the permittivity of the semiconductor device, $E_{critical}$ is a critical electric field strength and q is the elementary charge.

As was explained in the foregoing, according to the semiconductor device of Embodiment 1, a situation in which the electric field strength at the bottom of the trench is the largest value in the substrate can be avoided. Thus, a trade-off between a breakdown voltage and an on-voltage (on-resistance) is improved. Moreover, the electric field strength at the bottom of the trench can be significantly lowered to enable enhanced reliability of the gate oxide film. Furthermore, an amount of an increase (or an amount of a decrease) in the electric field strength can be controlled.

Embodiment 2

Next, a method of manufacturing the semiconductor device according to Embodiment 2 will be explained. In Embodiment 1, the whole drift layer in between p-type channel region 4 and the n-type semiconductor substrate was provided as the superjunction layer. Embodiment 2, however, differs from Embodiment 1 in that a part of the drift layer is provided as the superjunction layer.

Figure 8:
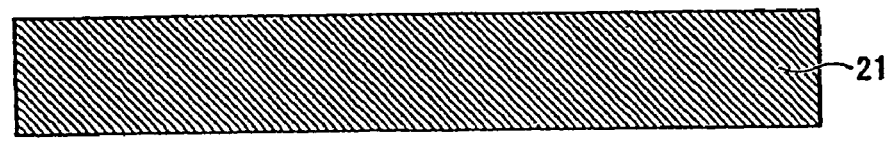
FIG. 8 is a cross sectional view showing an arrangement in the course of manufacturing the semiconductor device according to Embodiment 2 in the step of preparing an n-type semiconductor substrate.

FIGS. 8 to 13 are cross sectional views showing arrangements in the steps of manufacturing the semiconductor device according to Embodiment 2. First, as shown in FIG. 8, an n-type semiconductor substrate 21 is prepared with the direction of crystal plane taken as (100) and an impurity concentration which is sufficiently high.

Figure 9:
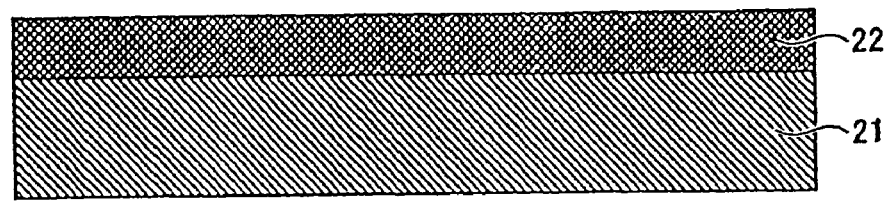
FIG. 9 is a cross sectional view showing an arrangement in the course of manufacturing the semiconductor device according to Embodiment 2 in the step next to that shown in FIG. 8 in which an n-type silicon layer is formed on the n-type semiconductor substrate.
Figure 10:
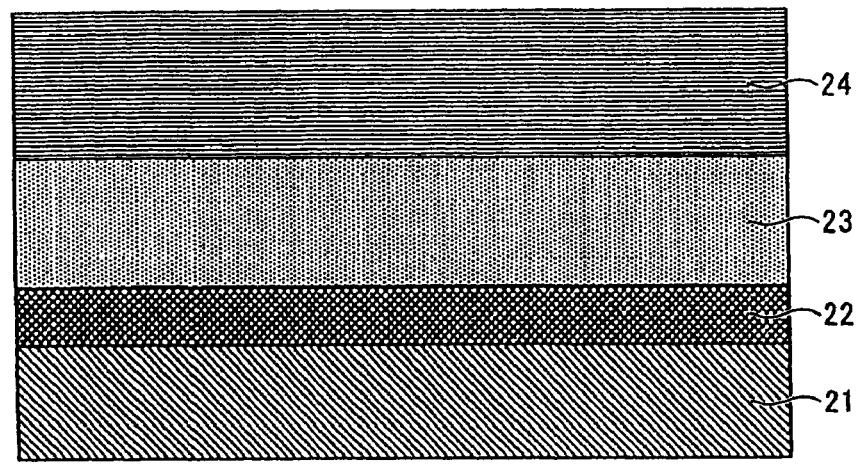
FIG. 10 is a cross sectional view showing an arrangement in the course of manufacturing the semiconductor device according to Embodiment 2 in the step next to that shown in FIG. 9 in which two n-type silicon layers each with a different impurity concentration are further formed in order on the surface of the n-type silicon layer on the n-type semiconductor substrate.

Then, as shown in FIG. 9, n-type silicon layer 22 with a concentration of impurities such as phosphorus atoms, for example, being on the order of $1.0 \times 10^{15}$ cm$^{-3}$, is epitaxially grown on n-type semiconductor substrate 21. Next to this, as shown in FIG. 10, n-type silicon layer 23 with a concentration of impurities such as phosphorus atoms, for example, being on the order of $4.46 \times 10^{15}$ cm$^{-3}$, is epitaxially grown on the surface of n-type silicon layer 22 to a thickness of, for example, 25 μm. Furthermore, n-type silicon layer 24 with a concentration of impurities such as phosphorus atoms being on the order of $4.1 \times 10^{15}$ cm$^{-3}$, is epitaxially grown to a thickness of, for example, 25 μm.

Figure 11:
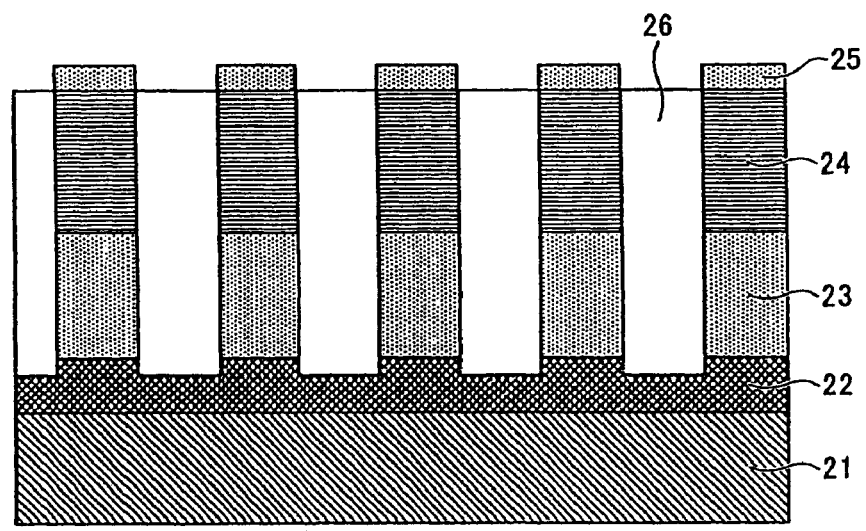
FIG. 11 is a cross sectional view showing an arrangement in the course of manufacturing the semiconductor device according to Embodiment 2 in the step next to that shown in FIG. 10 in which trenches are formed in the n-type silicon layers with a patterned oxide film that is formed on the n-type silicon layer used as a mask.
Figure 12:
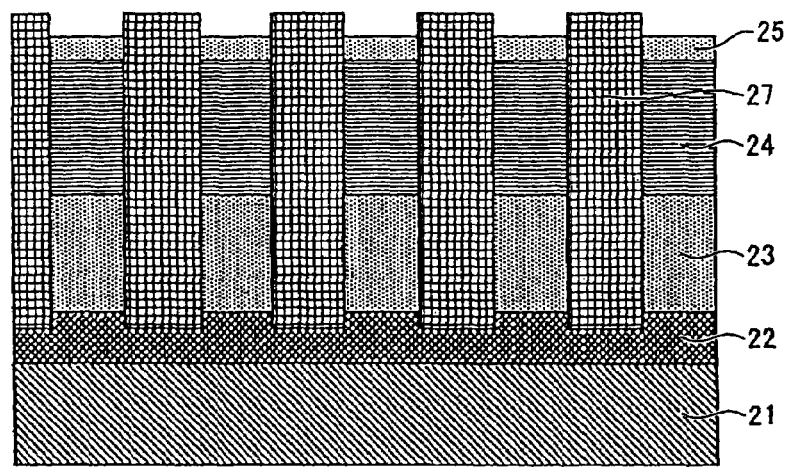
FIG. 12 is a cross sectional view showing an arrangement in the course of manufacturing the semiconductor device according to Embodiment 2 in the step next to that shown in FIG. 11 in which a p-type semiconductor is made grown in each of the trenches to fill the trench.

Then, as shown in FIG. 11, in the same way as that in Embodiment 1, trenches 26 are formed using oxide film 25 as a mask. Following this, as shown in FIG. 12, boron-doped p-type semiconductor 27 is epitaxially grown in each of trenches 26 to fill trench 26 with p-type semiconductor 27. At this time, the epitaxially grown layer of p-type semiconductor 27 is grown until the grown layer is higher than the upper surface of the mask 25. P-type semiconductor 27 filling trench 26 becomes the p-type partition region of the superjunction layer. Moreover, n-type silicon layer 23 and n-type silicon layer 24 form the superjunction layer together with p-type semiconductor 27.

Figure 13:
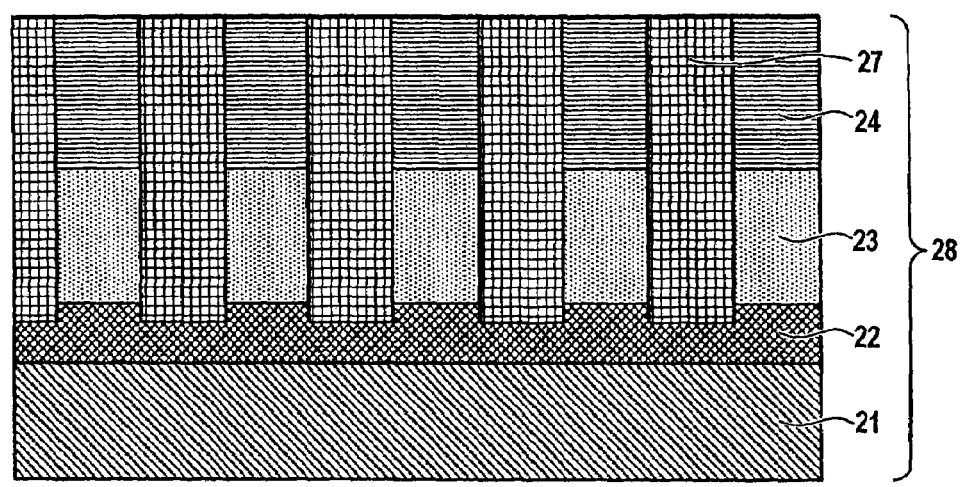
FIG. 13 is a cross sectional view showing an arrangement in the course of manufacturing the semiconductor device according to Embodiment 2 in the step next to that shown in FIG. 12 in which planarization of the surface of parallel p-n junctions is carried out to form the superjunction semiconductor substrate.

Then, as shown in FIG. 13, planarization of the surface of parallel p-n junctions is carried out by CMP (Chemical Mechanical Polishing) and oxide film etching to form superjunction semiconductor substrate 28. At this time, the thickness of the superjunction layer in superjunction semiconductor substrate 28 is taken as, for example, 47 μm. After this, with the method like in the related art shown in Embodiment 1, a MOSFET is formed.

The on-resistance of superjunction semiconductor substrate 28 is approximately 16 mΩcm$^2$. Thus, the semiconductor device manufactured by the manufacturing method of a semiconductor device according to Embodiment 2 exhibits an excellent trade-off characteristic between a breakdown voltage and on-resistance (not shown). This is because the superjunction layer or n-type drift region 2 is formed with a phosphorus concentration within the range of the values expressed by the following expression (5):

$$N_{1min-semiconductor} \geq \frac{\varepsilon_{semiconductor} \times E_{critical}^2}{4 \times q \times V_{BD}} \quad (5)$$

where $N_{1min-semiconductor}$ is the average value of an impurity concentration in the n-type drift region, $V_{BD}$ is the maximum preventable voltage of the semiconductor device, $\epsilon_{semiconductor}$ is the permittivity of the semiconductor device, $E_{critical}$ is a critical electric field strength and q is the elementary charge.

The average impurity concentration of the section of the superjunction layer in the semiconductor device manufactured by the manufacturing method of a semiconductor can be calculated. The average impurity concentration of the section of the superjunction layer is calculated by the following expression (6):

$$\{A-(B+C)\}/D=8.4255\times10^{13} \quad (6)$$

where "A" denotes an amount of impurity per unit volume in the p-type semiconductor 27, A=4.46×10¹⁵ (an impurity concentration, cm⁻³)×0.0005 (a width, cm)×0.0047 (a thickness after the planarization, cm)×1 (a depth, cm), "B" denotes an amount of impurity per unit volume in n-type silicon layer 23, B=4.46×10¹⁵ (an impurity concentration, cm⁻³)×0.0005 (a width, cm)×0.0025 (a thickness)×1 (a depth, cm), "C" denotes an amount of impurity per unit volume in n-type silicon layer 24, C=4.1×10¹⁵ (an impurity concentration, cm⁻³)×0.0005 (a width, cm)×0.0022 (a thickness after the planarization, cm)×1 (a depth, cm), and "D" denotes total volume of A+B+C, D=0.001 (a width, cm)×0.0047 (a thickness after the planarization, cm)×1 (a depth, cm).

From expression (6), the average impurity concentration of the superjunction layer is calculated as 8.4×10¹³ cm⁻³ in p-type to confirm that the impurity concentration in the p-type partition region is higher than that in the n-type drift region. In this way, the average impurity concentration in a layer forming a superjunction layer is preferably determined as 8.4×10¹³ cm⁻³ (p-type).

As was explained in the foregoing, according to the manufacturing method of the semiconductor device of Embodiment 2, a situation in which electric field strength at the bottom of the trench is the largest value in the substrate can be avoided. Thus, a trade-off between breakdown voltage and on-voltage (on-resistance) can be improved. Moreover, the electric field strength at the bottom of the trench can be significantly lowered to enable enhanced reliability of the gate oxide film. Furthermore, an amount of an increase (or an amount of a decrease) in the electric field strength can be made controlled.

Figure 26:
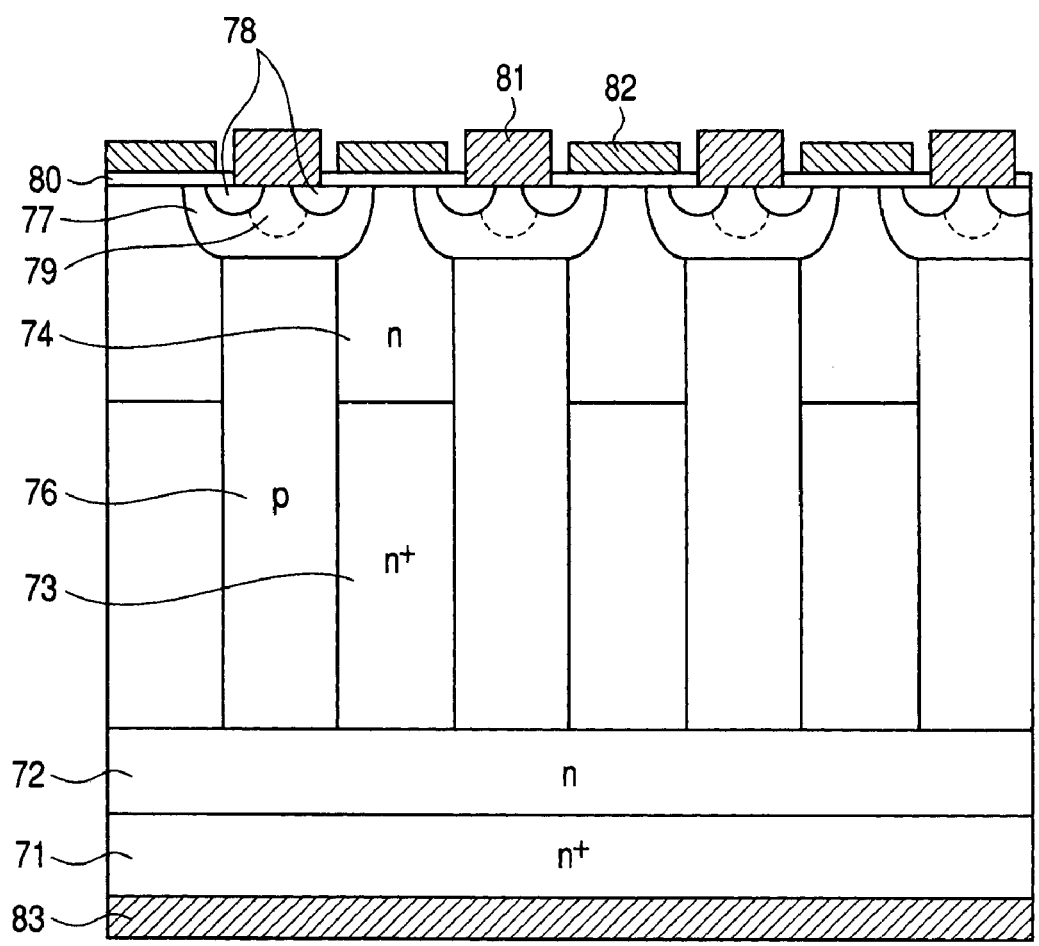
FIG. 26 is a cross sectional view showing an example of a modification of Embodiment 2.
Figure 27:
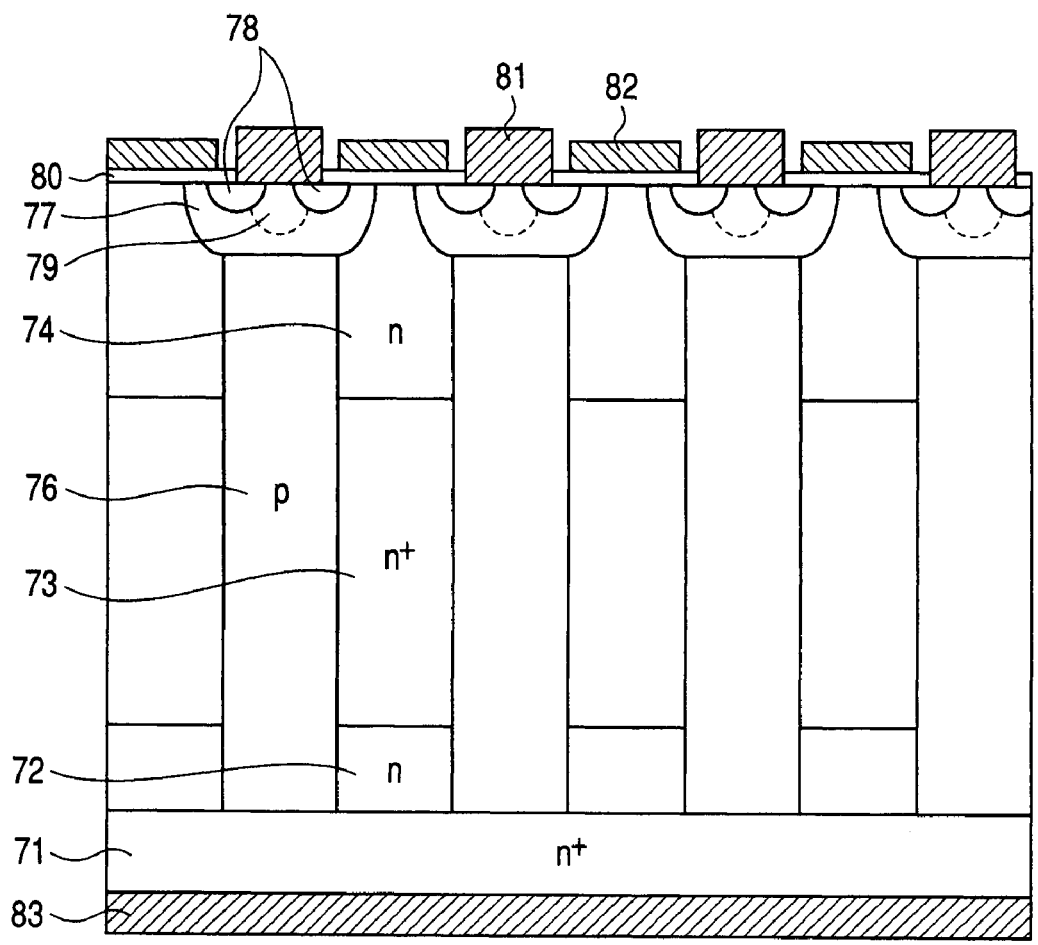
FIG. 27 is a cross sectional view showing an example of a modification of Embodiment 2.
Figure 28:
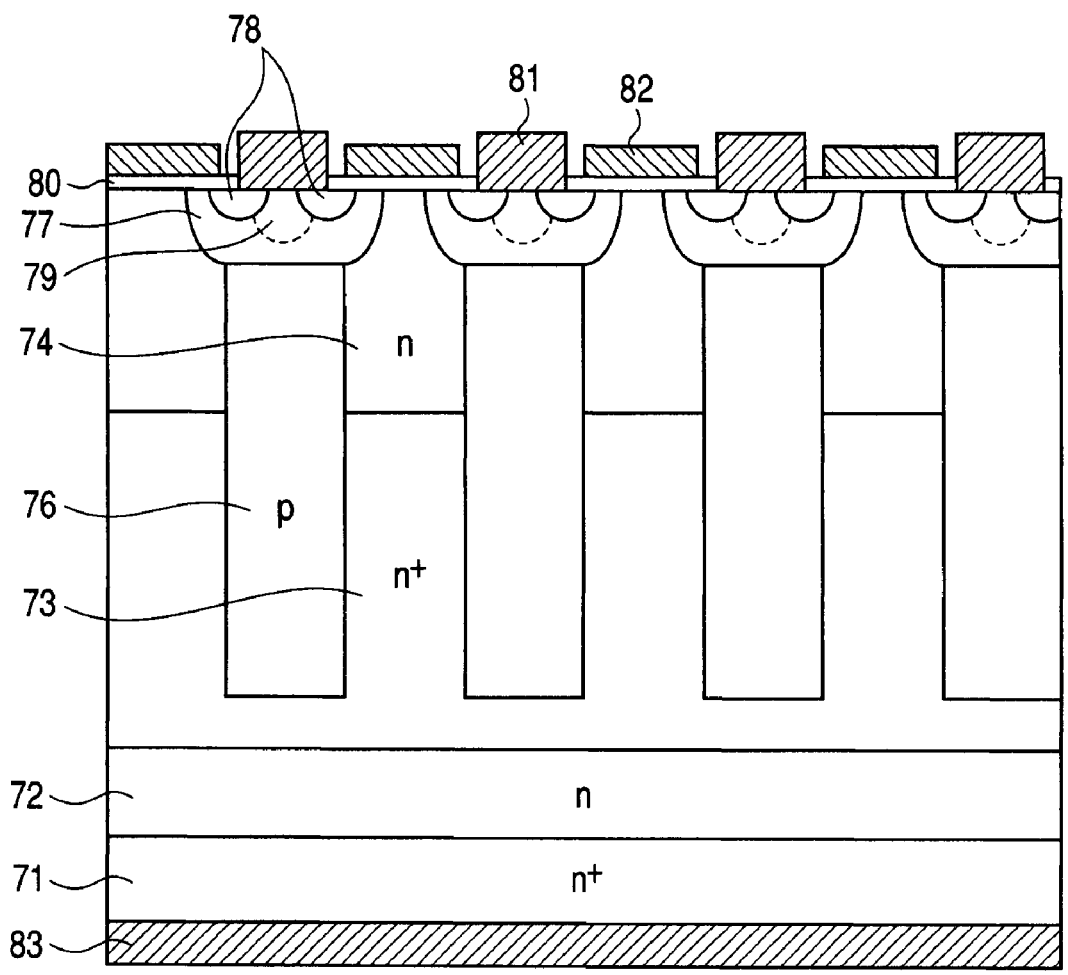
FIG. 28 is a cross sectional view showing an example of a modification of Embodiment 2.

FIGS. 26 to 28 are cross sectional views showing examples of a modification of Embodiment 2. In each of the examples shown in FIGS. 26 to 28, n-type silicon layer 72, n⁺-type silicon layer 73 and n-type silicon layer 74 are epitaxially grown on n-type semiconductor substrate 71. The impurity concentration and thickness of each of the layers are the same as those in Embodiment 2. Numeral 76 denotes a p-type semiconductor formed in each trench by epitaxial growth. Numeral 77 denotes p-type channel regions, numeral 78 denotes n-type source regions, numeral 79 denotes p⁺-type body regions, numeral 80 denotes gate oxide films, numeral 81 denotes source electrodes, numeral 82 denotes gate electrodes and numeral 83 denotes a drain region.

The points of difference between Embodiment 2 and the examples shown in FIGS. 26 to 28 are as follows.

In Embodiment 2, p-type semiconductors 27 protruded into n-type silicon layer 22. In the example shown in FIG. 26, the depth of the end of each of the n⁺-type silicon layers 73 and the depth of the end of each of p-type semiconductors 76 are the same. In the example shown in FIG. 27, p-type semiconductors 76 penetrate n-type silicon layer 72 to reach n-type semiconductor substrate 71. In the example shown in FIG. 28, no p-type semiconductor 76 reaches n-type silicon layer 72. The depth of p-type semiconductor 76 can be determined as required by changing the depth to which the trench is formed.

In Embodiment 2 and the examples shown in FIG. 26 to 28, the n-type silicon layer with a high impurity concentration and the n-type silicon layer with a low impurity concentration were epitaxially grown on the n-type semiconductor substrate or the n-type silicon layer before the trenches were formed, and the p-type semiconductor was formed in each of the trenches by epitaxial growth. In addition, the structure may be formed by, for example, previously forming the p-type semiconductor on the n-type semiconductor substrate or the n-type silicon layer by epitaxial growth, forming the trenches in the p-type semiconductor, epitaxially growing the n-type silicon layer with the high impurity concentration in each of the trenches, and epitaxially growing the n-type silicon layer with the low impurity concentration on the n-type silicon layer with the high impurity concentration. In this case, since the p-type semiconductor is formed beforehand, there is no variation among the depths of the p-type semiconductor layers.

Figure 29:
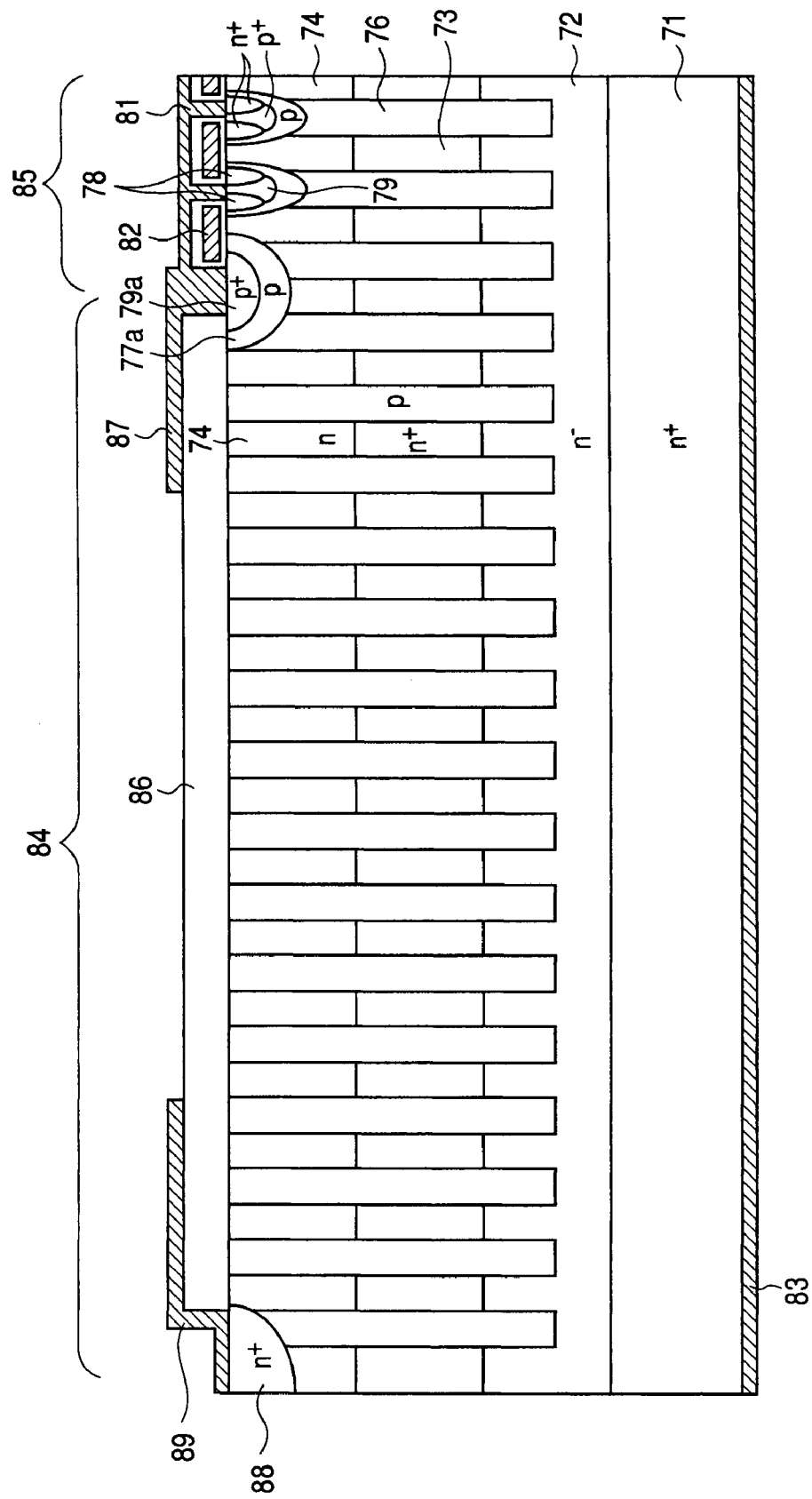
FIG. 29 is a cross sectional view of a non-active region showing an end structure of a semiconductor element.

FIG. 29 is a cross sectional view of a non-active region showing an end structure of a semiconductor element. In FIG. 29, although the depth of p-type semiconductor 76 is shown with the depth of p-type semiconductor 27 in Embodiment 2 (the form of protruding in the n-type silicon layer), the depth may be the depth of p-type semiconductor 76 in any one of FIGS. 26 to 28.

In FIG. 29, since numerals 71 to 83 denote the same parts as those in FIG. 26 to 28, explanations of the parts will be omitted. Numeral 85 denotes an active region letting a current flow as a MOSFET device, and numeral 84 denotes a non-active region in a breakdown voltage blocking structure section formed around the outer periphery of the active region 85 for preventing a breakdown of the element. In a p-type channel region 77a and a p⁺-type body region 79a in an outer end of the active region, no n-type source regions 78 are formed to provide no function as a transistor. Numeral 87 denotes a termination section functioning as a field plate extending on thick field insulator layer 86 from source electrode 81 toward the outside. The section on the peripheral side of non-active region 84 is covered by stopper electrode 89. Stopper electrode 89 is in contact with n⁺-type semiconductor region 88 provided on the surface layer of the peripheral section of non-active region 84.

Embodiment 3

Next, a method of manufacturing the semiconductor device according to Embodiment 3 will be explained. In Embodiment 1, the junction plane of the n-type drift region 2 and the p-type partition region 3 was formed at approximately 90° to the p-type channel region 4. Embodiment 3, however, differs from Embodiment 1 in that the junction plane is formed at approximately 89° to the p-type channel region.

Figure 14:
FIG. 14 is a cross sectional view showing an arrangement in the course of manufacturing the semiconductor device according to Embodiment 3 in the step of preparing an n-type semiconductor substrate.

FIGS. 14 to 18 are cross sectional views showing arrangements in the steps of manufacturing the semiconductor device according to Embodiment 3. First, as shown in FIG. 14, n-type semiconductor substrate 31 is prepared with the direction of crystal plane taken as (100) and an impurity concentration which is sufficiently high.

Figure 15:
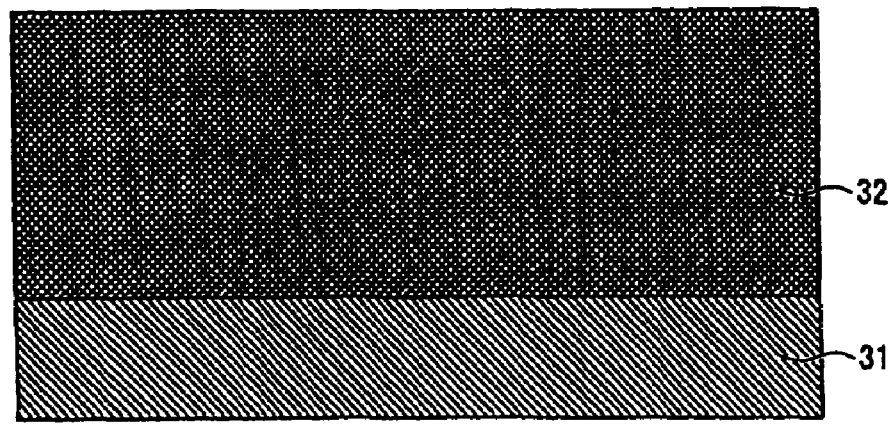
FIG. 15 is a cross sectional view showing an arrangement in the course of manufacturing the semiconductor device according to Embodiment 3 in the step next to that shown in FIG. 14 in which a p-type silicon layer is formed on the n-type semiconductor substrate.
Figure 16:
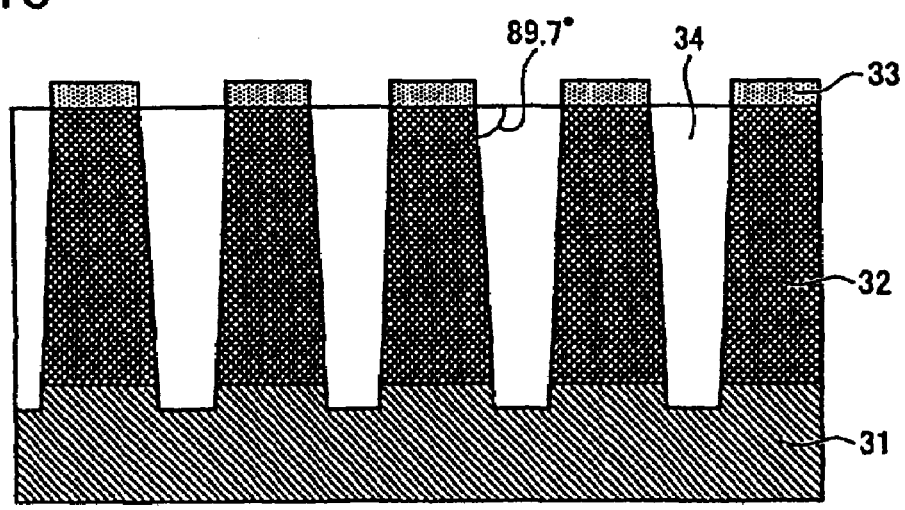
FIG. 16 is a cross sectional view showing an arrangement in the course of manufacturing the semiconductor device according to Embodiment 3 in the step next to that shown in FIG. 15 in which trenches are formed in the p-type silicon layer with a patterned oxide film that is formed on the p-type silicon layer used as a mask.

Then, as shown in FIG. 15, p-type silicon layer 32 with a concentration of impurities such as boron atoms, for example, being on the order of 4.46×10¹⁵ cm⁻³, is epitaxially grown on n-type semiconductor substrate 31 to a thickness of approximately 50 μm, for example. Following this, an oxide film with a thickness of, for example, 1.6 μm is grown on the surface layer of p-type silicon layer 32. Then, as shown in FIG. 16, patterning of the oxide film is carried out by photolithography or etching to form masks 33, each having a width of 5 μm, at intervals of 5 μm.

Figure 17:
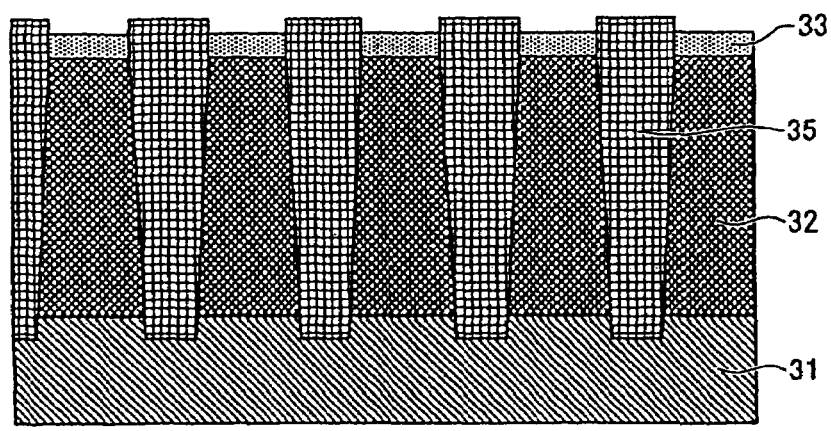
FIG. 17 is a cross sectional view showing an arrangement in the course of manufacturing the semiconductor device according to Embodiment 3 in the step next to that shown in FIG. 16 in which an n-type silicon layer is made grown inside each of the trenches.

After masks 33 are formed, by carrying out dry etching, for example, trenches 34 are formed in p-type silicon layer 32. At this time, trenches 32 are formed so that the angle formed by the sidewall of each of trenches 34 and n-type semiconductor substrate 31 is 89.7°. Then, as shown in FIG. 17, n-type silicon layer 35 including phosphorus atoms as impurities, for example, on the order of $4.46 \times 10^{15}$ cm$^{-3}$, is grown inside each of trenches 34. At this time, n-type silicon layer 35 is formed so that it is higher than the upper surfaces of masks 33.

Figure 18:
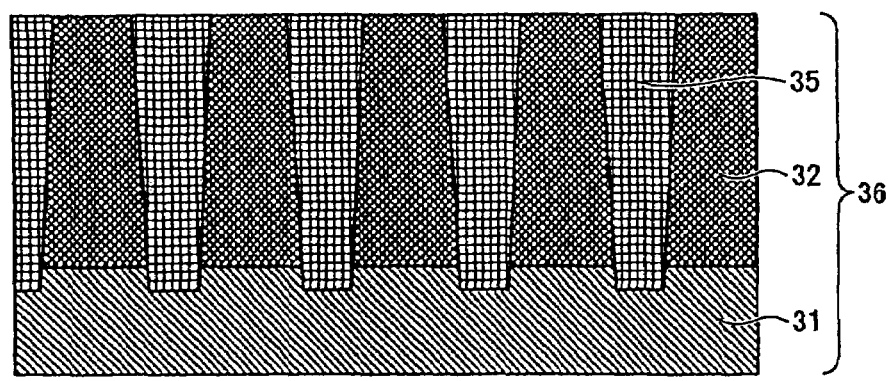
FIG. 18 is a cross sectional view showing an arrangement in the course of manufacturing the semiconductor device according to Embodiment 3 in the step next to that shown in FIG. 17 in which planarization of the surface of parallel p-n junctions is carried out to form the superjunction semiconductor substrate.

Subsequent to this, as shown in FIG. 18, planarization of the surface of parallel p-n junctions is carried out by CMP (Chemical Mechanical Polishing) and oxide film etching to form superjunction semiconductor substrate 36. At this time, the thickness of the superjunction layer in superjunction semiconductor substrate 36 is taken as, for example, 47 μm. After this, with the method as in the related art shown in Embodiment 1, a MOSFET is formed. The on-resistance of superjunction semiconductor substrate 36 is approximately 12 mΩcm².

The average impurity concentration of the section of the superjunction layer in the semiconductor device manufactured by the manufacturing method of a semiconductor according to the above-explained Embodiment 3 can be calculated. Half of the width of the p-type partition region of the superjunction layer is 2.5 μm on the side of the p-type channel region and 2.5+50×cos(89.7°)≈2.76 μm on the side of (high impurity concentration) semiconductor substrate 31. Half of the width of n-type drift region of the superjunction layer is 2.5 μm on the side of the p-type channel region and 2.5−50×cos(89.7°)≈2.24 μm on the side of (high impurity concentration) semiconductor substrate 31. Here, a thickness of the superjunction layer after the planarization of the surface is 47 μm, and that of the p-type channel region decreased by 3 μm. Consequently, a width of p-type partition region is 2.5+3×cos(89.7°)≈2.52, a width of n-type drift region is 2.5−3×cos(89.7°)≈2.48. Therefore, the average impurity concentration of the section of the superjunction layer can be calculated by the following expression (7):

$$\{E-F\}/G=2.4976 \times 10^{14} \quad (7)$$

where "E" denotes an amount of impurity per unit volume (a trapezoid shape) in the p-type region, E=(0.000252 (an upper side, cm)+0.000276 (a lower side))×0.0047 (a thickness after the planarization, cm)/2×1 (a depth, cm)×$4.46 \times 10^{15}$ (an impurity concentration, cm$^{-3}$), F denotes an amount of impurity per unit volume (a trapezoid shape) n the n-type drift region, F=(0.000248 (an upper side, cm)+0.000224 (a lower side))×0.0047 (a thickness after the planarization, cm)/2×1 (a depth, cm)×$4.46 \times 10^{15}$ (an impurity concentration, cm$^{-3}$) and G=0.0005 (a width of E+F, cm)×0.0047 (a thickness after the planarization, cm)×1 (a depth, cm).

From expression (7), the average impurity concentration of the superjunction layer is calculated as $2.5 \times 10^{14}$ cm$^{-3}$ to confirm that the impurity concentration in the p-type partition region is higher than that in the n-type drift region. In this way, the average impurity concentration in the superjunction layer is preferably determined as being $2.5 \times 10^{14}$ cm$^{-3}$ (p-type rich).

As was explained in the foregoing, a trade-off between a breakdown voltage and an on-voltage (on-resistance) can be improved according to Embodiment 3. Moreover, on-resistance can be reduced compared with that of the semiconductor device according to Embodiment 2. In addition, the electric field strength at the bottom of the trench can be significantly lowered to enable enhanced reliability of the gate oxide film. Furthermore, an amount of an increase (or an amount of a decrease) in the electric field strength can be made controlled.

EXAMPLES

Figure 19:
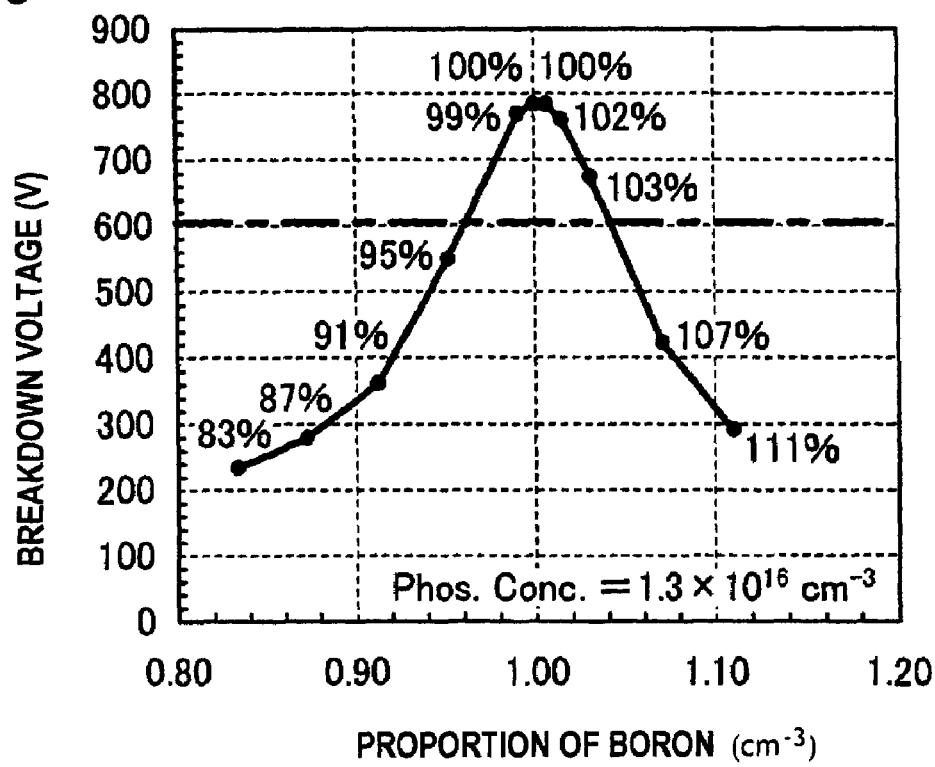
FIG. 19 is a graph showing a relationship between a proportion of boron and a breakdown voltage in the semiconductor device shown in FIG. 1.

Next, examples of the invention will be explained. FIG. 19 is a graph showing a relationship between a proportion of boron in the partition regions 3 and in the trench filling semiconductor material 16, and a breakdown voltage in the semiconductor device shown in FIG. 1. In the graph in FIG. 19, the vertical axis represents a breakdown voltage (V) and the horizontal axis represents a proportion of boron (cm$^{-3}$). The proportion of boron is specifically the proportion of boron to the concentration of phosphorus in the n-type drift region. Here, there is shown boron concentration dependence of a breakdown voltage of a superjunction diode when the phosphorus concentration in the n-type drift region 2 is fixed at on the order of $1.3 \times 10^{16}$ cm$^{-3}$, the boron concentration is changed and the thickness of the superjunction layer is taken as 45 μm.

In the graph shown in FIG. 19, a breakdown voltage increases with an increase in concentration of boron for the concentration of boron between 83% and 100%. With the concentration of boron at approximately 100% (the boron concentration is equal to the phosphorus concentration), the breakdown voltage has the maximum value (approximately 800 V) and decreases thereafter as the boron concentration increases. At this time, a breakdown voltage of 600 V or above is maintained even with the boron concentration shifted several percent from 100%. Specifically, when the boron concentration is approximately from 97% to 104%, a breakdown voltage of 600 V or above is maintained.

From the foregoing, it is preferable that the relationship between the impurity concentrations of the drift region 2 and that of the p-type partition region satisfies the following expression (8):

$$N_{2\text{-}superjunction} \geqq 1.02 \times N_{1\text{-}superjunction} \quad (8)$$

where $N_{2\text{-}superjunction}$ is the average value of the impurity concentration of the p-type partition region 3 and $N_{1\text{-}superjunction}$ is the average value of the impurity concentration of the n-type drift region 2.

Figure 20:
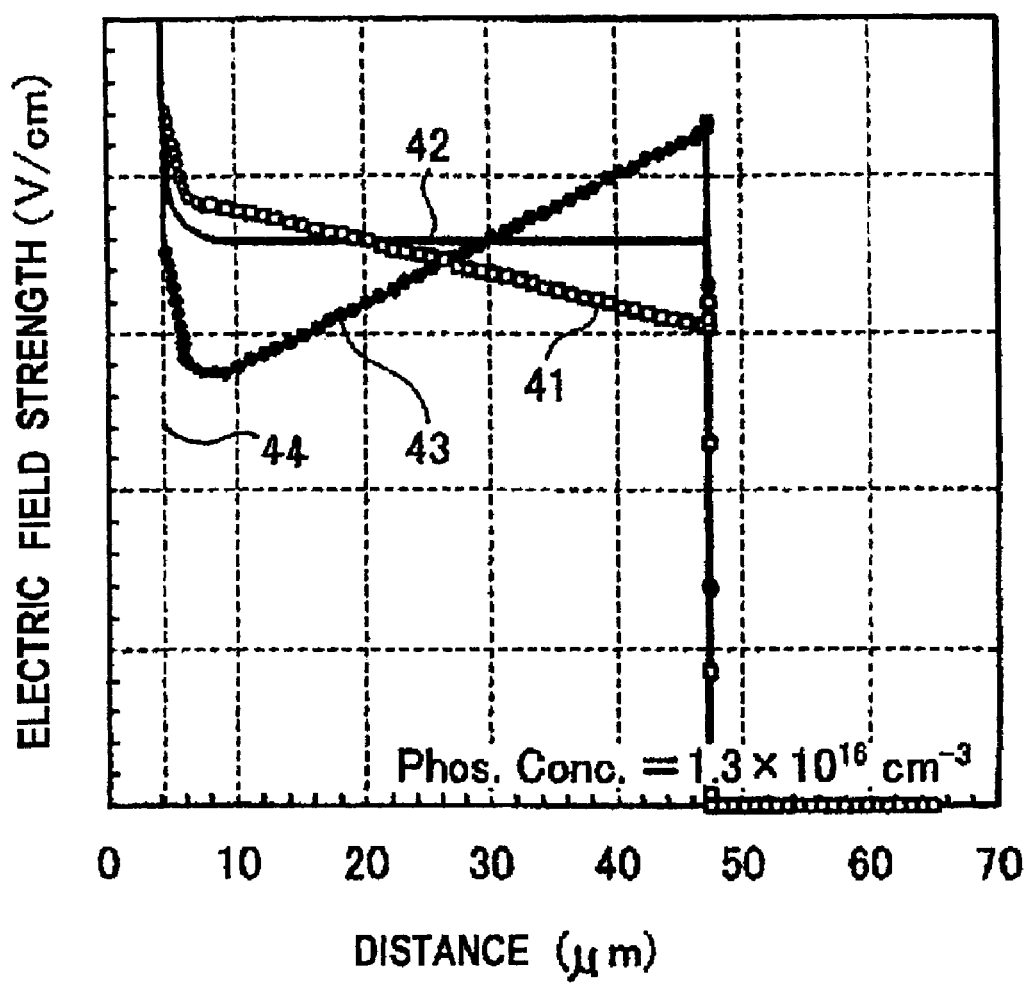
FIG. 20 is a graph showing electric field strength in the direction of the thickness of a semiconductor device.

Next, electric field strength in the direction of the thickness of the semiconductor device will be shown. FIG. 20 is a graph showing electric field strength in the direction of the thickness of a semiconductor device. In the graph in FIG. 20, the vertical axis represents electric field strength (V/cm) and the horizontal axis represents a distance (μm) from the surface of the p-type channel region 4 in the direction of the thickness of the device. Reference numerals 41, 42 and 43 denote the results of simulations of electric field strength distributions in the direction of the thickness of the semiconductor device in the cases with the boron concentrations taken as 99%, 100% (boron concentration=phosphorus concentration) and 102%, respectively, of the phosphorus concentrations. A broken line 44 in the graph shows the depth at which the bottom of trench 5 is formed.

In FIG. 20, when the boron concentration is taken as 99% of the phosphorus concentration, as in the related substrate structure, the electric field strength on the side of the p-type channel region is higher as shown by electric field strength distribution 41. When the boron concentration is made equal (100%) to the phosphorus concentration, the electric field strength on the side of the p-type channel region is approximately equal to that on the side of (high impurity concentration) semiconductor substrate 1 as shown by electric field strength distribution 42. When the boron concentration is taken as 102% of the phosphorus concentration, it is known that the electric field strength on the side of (high impurity concentration) semiconductor substrate 1 is the highest, as shown by electric field strength distribution 43. As was explained in the foregoing, the impurity concentration in p-type partition region 3 higher than the impurity concentration in n-type drift region 2 causes the inclination of the electric field strength distribution characteristic to be reversed. That is, while the inclination of the electric field strength distribution characteristic was negative when the boron concentration was 99% of the phosphorus concentration, the inclination is positive when the boron concentration is taken as 102% of the phosphorus concentration.

Figure 25:
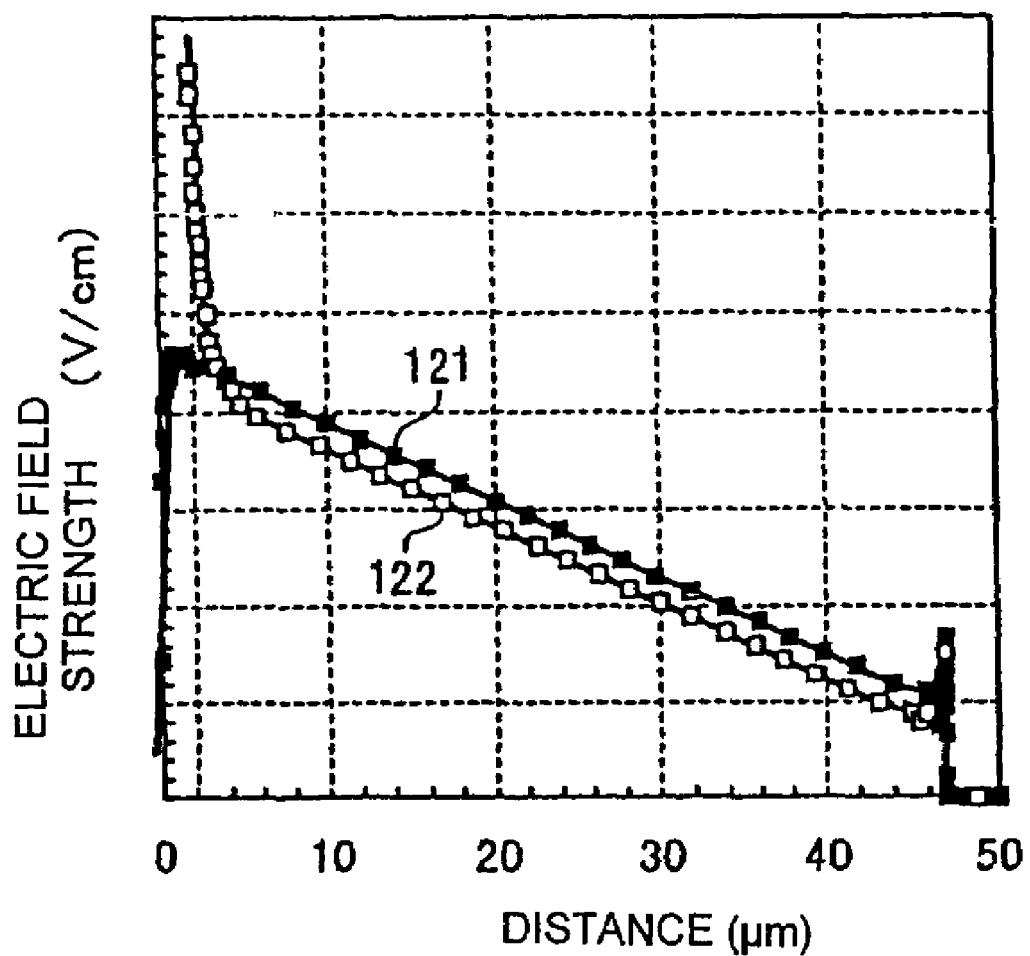
FIG. 25 is a graph showing respective electric field strength distributions of a trench gate MOSFET and a diode structure without trench being formed, both at avalanche breakdown.

Formation of the trench gate structure increases the electric field strength at the bottom of trench 5 as shown in FIG. 25. Therefore, it is clear that the breakdown voltage of the semiconductor substrate when the boron concentration was taken as 99% or 100% of the phosphorus concentration is determined by the electric field strength at the bottom of trench 5.

When the average impurity concentration of the superjunction layer (the average impurity concentration of n-type drift region 2 minus the average impurity concentration of p-type partition region 3) is the n-type (specifically, when the average impurity concentration of n-type drift region 2 is larger than the average impurity concentration of p-type partition region 3), the electric field strength on the side of p-type channel region 4 is higher as in the case of using the n-type substrate with the related structure. Furthermore, formation of trench 5 increases the electric field strength at the bottom of trench 5. This causes reduction in the breakdown voltage of the semiconductor device and degradation in the reliability of the oxide film.

When the average impurity concentration of the superjunction layer is the p-type (specifically, when the average impurity concentration of p-type partition region 3 is larger than the average impurity concentration of n-type drift region 2), the electric field strength on the side of (high impurity concentration) n-type semiconductor substrate 1 is higher than that on the side of p-type channel region 4 with further reduction in the electric field strength at the bottom of trench 5. This enables the degree of reduction in the breakdown voltage of the semiconductor device to be reduced. Furthermore, the electric field strength at the bottom of the trench 5, although it exhibits a significant increase in its relative value, is reduced in its absolute value as explained above. This also enhances the reliability of the gate oxide film. In this way, by varying the proportion between the boron concentration and the phosphorus concentration, control of an amount of increase or decrease in the electric field strength becomes possible.

Figure 21:
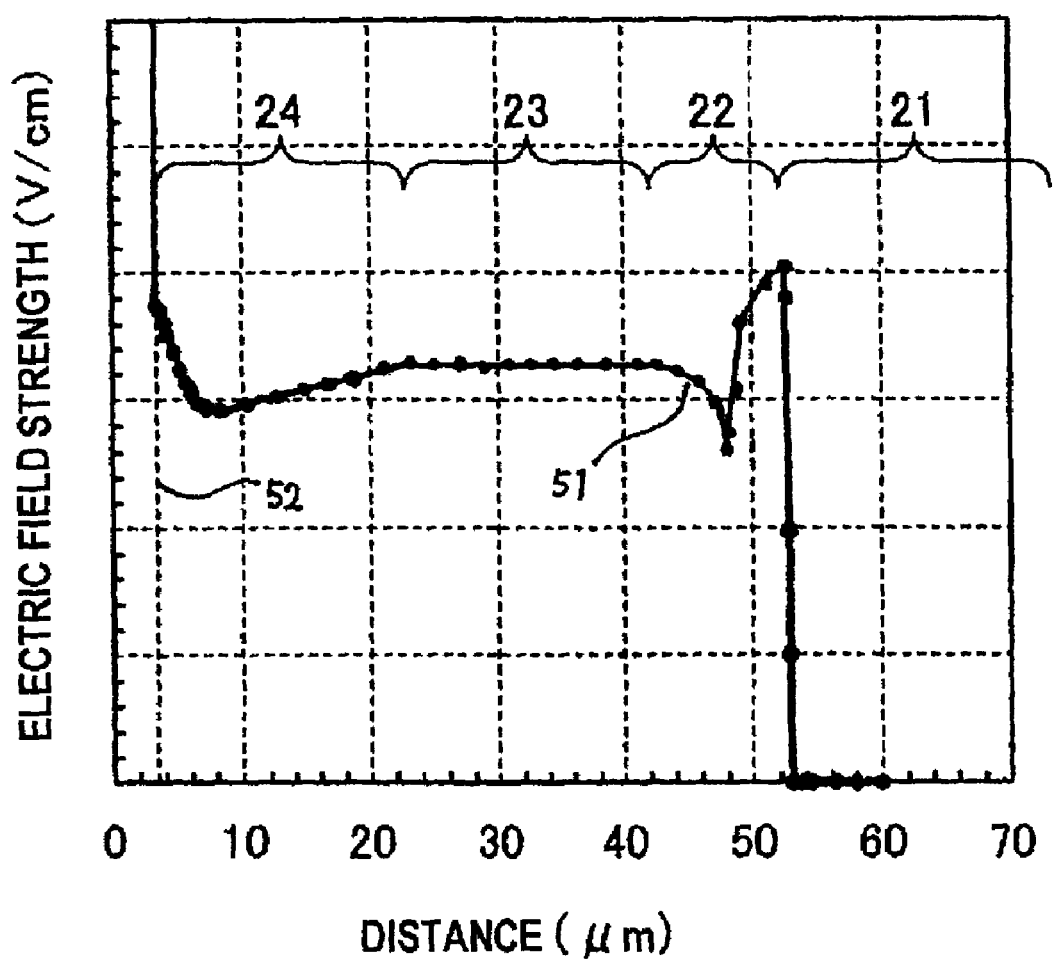
FIG. 21 is a graph showing an electric field strength distribution in the direction of the thickness of a semiconductor device manufactured by the manufacturing method according to Embodiment 2.

Next, an electric field strength distribution at avalanche breakdown of a superjunction trench MOSFET will be shown which is manufactured by the manufacturing method of a semiconductor device according to Embodiment 2. FIG. 21 is a graph showing an electric field strength distribution in the direction of the thickness of a semiconductor device manufactured by the manufacturing method according to Embodiment 2. In FIG. 21, the vertical axis represents electric field strength (V/cm) and the horizontal axis represents a distance ($\mu$m) from the surface of the p-type channel region 4 in the direction of the thickness of the semiconductor device. Reference numeral 51 denotes the electric field strength distribution. A broken line 52 shows the depth at which the bottom of the trench 5 is formed. Open brackets with reference numerals 21 to 24 in the graph show the ranges of n-type semiconductor substrate 21 and n-type silicon layers 22 to 24, respectively, shown in each of FIGS. 10 to 13.

In n-type silicon layer 24, the electric field strength takes the minimum value in the vicinity of the trench and then increases with an increase in the distance from the surface of p-type channel region 4. In n-type silicon layer 23, the electric field strength is approximately constant. In n-type silicon layer 22, the electric field strength decreases and then increases sharply with a large fall occurring in the vicinity of the boundary with n-type semiconductor substrate 21. It is known that, with the impurity concentration in the p-type partition region thus given as being higher than the impurity concentration of the n-type drift region, the electric field strength in the vicinity of the bottom of the trench is lower than the electric field strength in n-type silicon layer 23.

Figure 22:
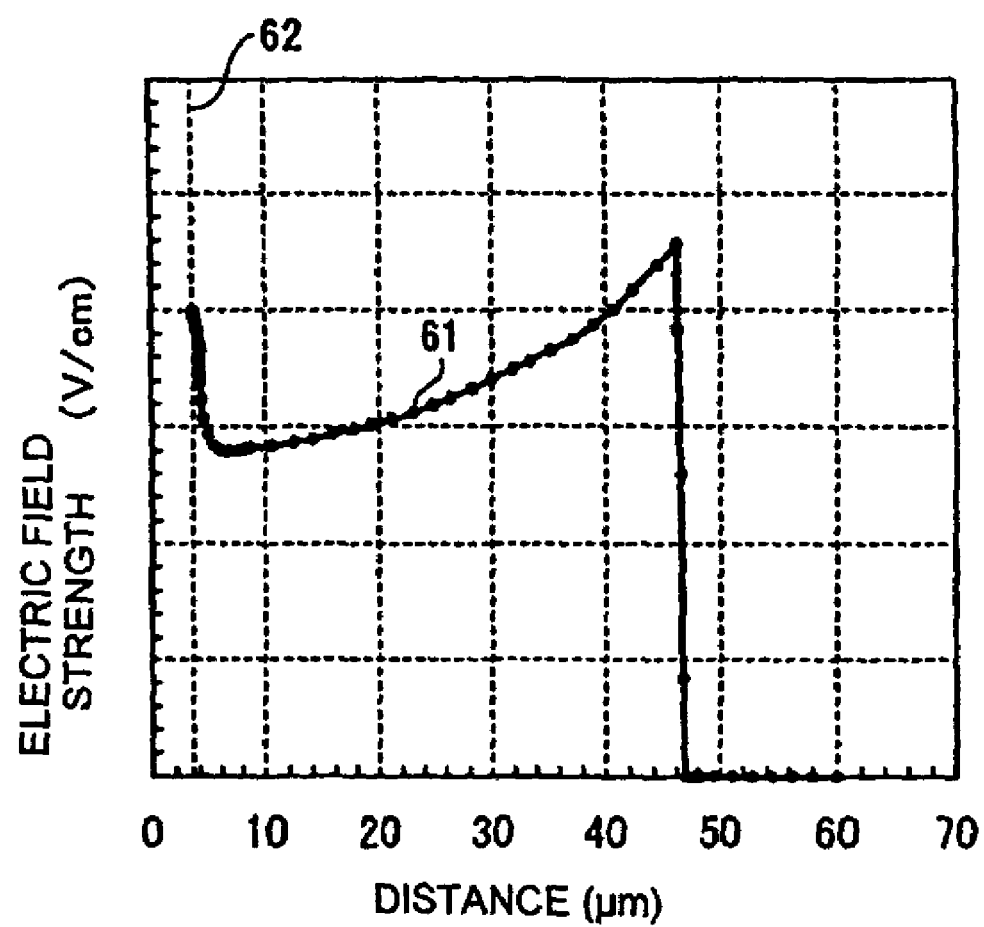
FIG. 22 is a graph showing an electric field strength distribution in the direction of the thickness of a semiconductor device manufactured by the manufacturing method according to Embodiment 3.
Figure 23:
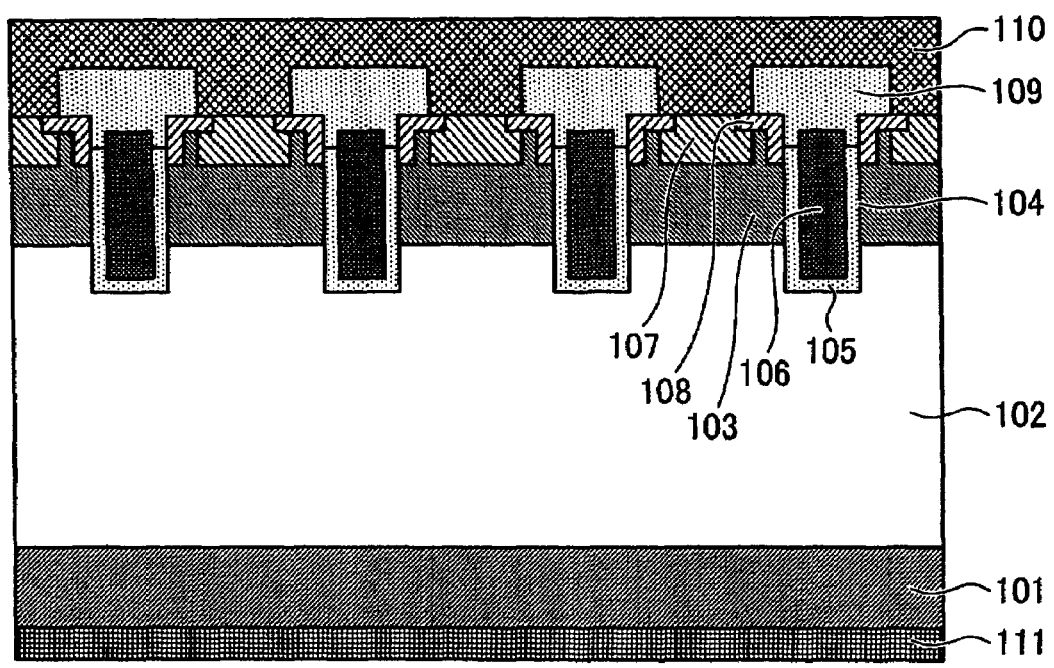
FIG. 23 is a cross sectional view showing an example of a structure of a related vertical MOSFET.
Figure 24:
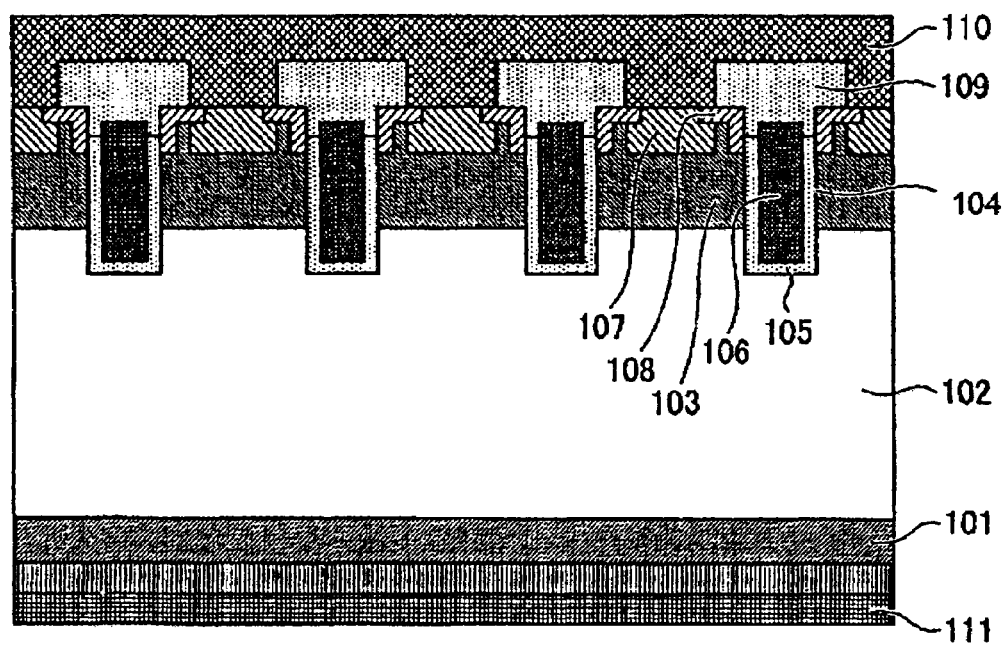
FIG. 24 is a cross sectional view showing an example of a structure of a related vertical IGBT.

Next, an electric field strength distribution at avalanche breakdown of a superjunction trench MOSFET will be shown which is manufactured by the manufacturing method of a semiconductor device according to Embodiment 3. FIG. 22 is a graph showing an electric field strength distribution in the direction of the thickness of a semiconductor device manufactured by the manufacturing method according to Embodiment 3. In FIG. 22, the vertical axis represents electric field strength (V/cm) and the horizontal axis represents a distance ($\mu$m) from the surface of p-type channel region 4 in the direction of the thickness of the semiconductor device. Reference numeral 61 denotes the electric field strength distribution. A broken line 62 shows the depth at which the bottom of trench 5 is formed.

The electric field strength takes the minimum value in the vicinity of the trench in the superjunction layer and then monotonically increases with an increase in the distance from the surface of p-type channel region 4, with a rise for the distance to the vicinity of the boundary between the superjunction layer and the n-type semiconductor substrate. It is known that, by thus giving the impurity concentration in the p-type partition region as being higher than the impurity concentration of the n-type drift region, the electric field strength in the vicinity of the bottom of the trench is lower than the electric field strength in n-type silicon layer 31.

In each of the Embodiments 1 to 3, a trench gate MOSFET was explained as an example of the semiconductor device. The invention, however, is not limited to the trench gate MOSFET, but can be also applied to a planar semiconductor element, for example.

As was explained in the foregoing, with the semiconductor device and the manufacturing method of the semiconductor device according to the invention, by weakening the electric field strength at the bottom of a trench, a breakdown voltage of a semiconductor device can be enhanced and, at the same time, an on-voltage of the semiconductor device can be lowered.

As shown in the foregoing, the semiconductor device and the manufacturing method of the semiconductor device according to the invention are useful for manufacturing a high power semiconductor element. In particular, the semiconductor device and the manufacturing method are suited for a semiconductor device in which enhancement of a breakdown voltage and improvement in an on-characteristic can be made compatible such as a MOSFET, an IGBT and a bipolar transistor each having a superjunction layer in a drift region.

While the present invention has been particularly shown and described with reference to preferred embodiments, it will be understood by those skilled in the art that the foregoing and other changes in form and details can be made therein without departing from the spirit and scope of the present invention. Accordingly, it should be understood that the embodiments described herein are illustrative only and are not limiting upon the scope of the invention.

What is claimed is:

1. A semiconductor device comprising:
   a first conductivity type semiconductor substrate;
   a second conductivity type channel region; and
   a junction layer provided between the first conductivity type semiconductor substrate and the second conductivity type channel region, the junction layer having a plurality of first conductivity type semiconductor regions and a plurality of second conductivity type semiconductor regions alternately arranged in a direction in parallel with the principal surface of the first conductivity type semiconductor substrate,
   the second conductivity type semiconductor region having a higher average impurity concentration than the first conductivity type semiconductor region, and
   the second conductivity type semiconductor region having an impurity concentration that is uniform in a thickness direction of the semiconductor substrate, and the first conductivity type semiconductor region comprising a plurality of first conductivity type layers whose respective impurity concentrations are different from one another.

2. The semiconductor device as claimed in claim 1, wherein the second conductivity type channel region has a plurality of trenches formed from the surface thereof so as to reach the junction layer, each of the trenches having an insulator film formed on the inside face thereof and being filled with an electrode, with the insulator film in between the trench and the electrode.

3. The semiconductor device as claimed in claim 1, wherein the first conductivity type semiconductor region has an impurity concentration whose average value ($N_{1\text{-}semiconductor}$) satisfies the following expression (1):

$$N_{1-semiconductor} \geq \frac{\varepsilon_{semiconductor} \times E^2_{critical}}{4 \times q \times V_{BD}} \quad (1)$$

where $V_{BD}$ is the maximum preventable voltage of the semiconductor device, $\varepsilon_{semiconductor}$ is the permittivity of the semiconductor device, $E_{critical}$ is a critical electric field strength and q is the elementary charge.

4. The semiconductor device as claimed in claim 1, wherein the first conductivity type semiconductor region is formed of a plurality of layers of the first conductivity type having impurity concentrations that are different from one another, of which the layer with the lowest impurity concentration has an impurity concentration whose average value ($N_{1min\text{-}semiconductor}$) satisfies the following expression (2):

$$N_{1\min-semiconductor} \geq \frac{\varepsilon_{semiconductor} \times E^2_{critical}}{4 \times q \times V_{BD}} \quad (2)$$

where $V_{BD}$ is the maximum preventable voltage of the semiconductor device, $\varepsilon_{semiconductor}$ is the permittivity of the semiconductor device, $E_{critical}$ is a critical electric field strength and q is the elementary charge.

5. The semiconductor device as claimed in claim 1, wherein the correlation of the average value ($N_{2\text{-}superjunction}$) of the impurity concentration of the second conductivity type semiconductor region and the average value ($N_{1\text{-}superjunction}$) of the impurity concentration of the first conductivity type semiconductor region is expressed by the following expression (3):

$$N_{2\text{-}superjunction} \geq 1.02 \times N_{1\text{-}superjunction} \quad (3)$$

6. The semiconductor device as claimed in claim 1, wherein a width of the second conductivity type semiconductor region spreads in a thickness direction of the semiconductor substrate, and the average impurity concentration of the junction layer is $2.4 \times 10^{14}$ cm$^{-3}$ or more.

7. The semiconductor device as claimed in claim 4, wherein the average impurity concentration of the junction layer is $8.4 \times 10^{13}$ cm$^{-3}$ or more.

8. The semiconductor device as claimed in claim 1, wherein the junction layer is formed in a stripe-like shape.

9. The semiconductor device as claimed in claim 2, wherein the insulator film is formed of a silicon oxide film.

10. The semiconductor device as claimed in claim 1, wherein the first conductivity type semiconductor region is formed of silicon.

11. The semiconductor device as claimed in claim 2, wherein the semiconductor device is a MOSFET.

12. The semiconductor device as claimed in claim 2, wherein the semiconductor device is an insulated gate bipolar transistor.

13. The semiconductor device as claimed in claim 2, wherein the electrode filling the trench does not reach the semiconductor substrate.

14. The semiconductor device as claimed in claim 2, wherein the electrode filling the trench reaches the semiconductor substrate.

* * * * *